(12) United States Patent
Ting et al.

(10) Patent No.: US 12,362,291 B2
(45) Date of Patent: Jul. 15, 2025

(54) SEMICONDUCTOR DEVICE AND METHOD

(71) Applicant: Taiwan Semiconductor Manufacturing Co., Ltd., Hsinchu (TW)

(72) Inventors: Kuo-Chiang Ting, Hsinchu (TW); Sung-Feng Yeh, Taipei (TW); Ta Hao Sung, Hsinchu (TW); Ming-Zhi Yang, Taichung (TW); Gao-Long Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/543,799

(22) Filed: Dec. 18, 2023

(65) Prior Publication Data
US 2025/0105172 A1 Mar. 27, 2025

Related U.S. Application Data

(60) Provisional application No. 63/607,843, filed on Dec. 8, 2023, provisional application No. 63/584,562, filed on Sep. 22, 2023.

(51) Int. Cl.
*H01L 21/768* (2006.01)
*H01L 23/00* (2006.01)
*H01L 23/522* (2006.01)
*H01L 23/538* (2006.01)

(52) U.S. Cl.
CPC ........ *H01L 23/562* (2013.01); *H01L 23/5383* (2013.01); *H01L 23/5386* (2013.01);
(Continued)

(58) Field of Classification Search
CPC ............... H01L 23/562; H01L 23/5383; H01L 23/5386; H01L 23/5389; H01L 24/05;
(Continued)

(56) References Cited

U.S. PATENT DOCUMENTS 8,993,380 B2  3/2015  Hou et al.
9,281,254 B2  3/2016  Yu et al.
(Continued)

FOREIGN PATENT DOCUMENTS

TW    202333249 A    8/2023

*Primary Examiner* — Walter H Swanson
(74) *Attorney, Agent, or Firm* — Slater Matsil, LLP

(57) ABSTRACT

An embodiment includes a method including forming a first interconnect structure over a first substrate, the first interconnect structure including dielectric layers and metallization patterns therein. The method also includes forming a redistribution via and a redistribution pad over the first interconnect structure, the redistribution via and the redistribution pad being electrically coupled to at least one of the metallization patterns of the first interconnect structure, the redistribution via and the redistribution pad having a same material composition. The method also includes forming a warpage control dielectric layer over the redistribution pad. The method also includes forming a bond via and a bond pad over the redistribution pad, the bond pad being in the warpage control dielectric layer, the bond via being electrically coupled to the redistribution pad.

20 Claims, 33 Drawing Sheets

(52) U.S. Cl.
CPC .......... *H01L 23/5389* (2013.01); *H01L 24/03* (2013.01); *H01L 24/05* (2013.01); *H01L 24/08* (2013.01); *H01L 24/19* (2013.01); *H01L 24/20* (2013.01); *H01L 24/80* (2013.01); *H01L 2224/0346* (2013.01); *H01L 2224/05008* (2013.01); *H01L 2224/05147* (2013.01); *H01L 2224/08145* (2013.01); *H01L 2224/214* (2013.01); *H01L 2224/215* (2013.01); *H01L 2224/80895* (2013.01); *H01L 2224/80896* (2013.01); *H01L 2924/01029* (2013.01); *H01L 2924/04642* (2013.01); *H01L 2924/05042* (2013.01); *H01L 2924/05994* (2013.01); *H01L 2924/3511* (2013.01)

(58) Field of Classification Search
CPC ......... H01L 24/08; H01L 24/19; H01L 24/20; H01L 24/80
See application file for complete search history.

(56) References Cited

U.S. PATENT DOCUMENTS

| | | | |
|---|---|---|---|
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 2015/0303174 | A1* | 10/2015 | Yu .................. H01L 24/19 438/109 |
| 2019/0139896 | A1* | 5/2019 | Hsu .................. H01L 23/5384 |
| 2019/0333870 | A1* | 10/2019 | Chen ................ H01L 23/49827 |
| 2020/0185330 | A1* | 6/2020 | Yu .................... H01L 24/97 |
| 2023/0078099 | A1 | 3/2023 | Ecton et al. |
| 2023/0260941 | A1 | 8/2023 | Hu et al. |

\* cited by examiner

SEMICONDUCTOR DEVICE AND METHOD

PRIORITY CLAIM AND CROSS-REFERENCE

This application claims the benefit of U.S. Provisional Application No. 63/584,562, filed on Sep. 22, 2023, and U.S. Provisional Application No. 63/607,843, filed Dec. 8, 2023, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (POP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
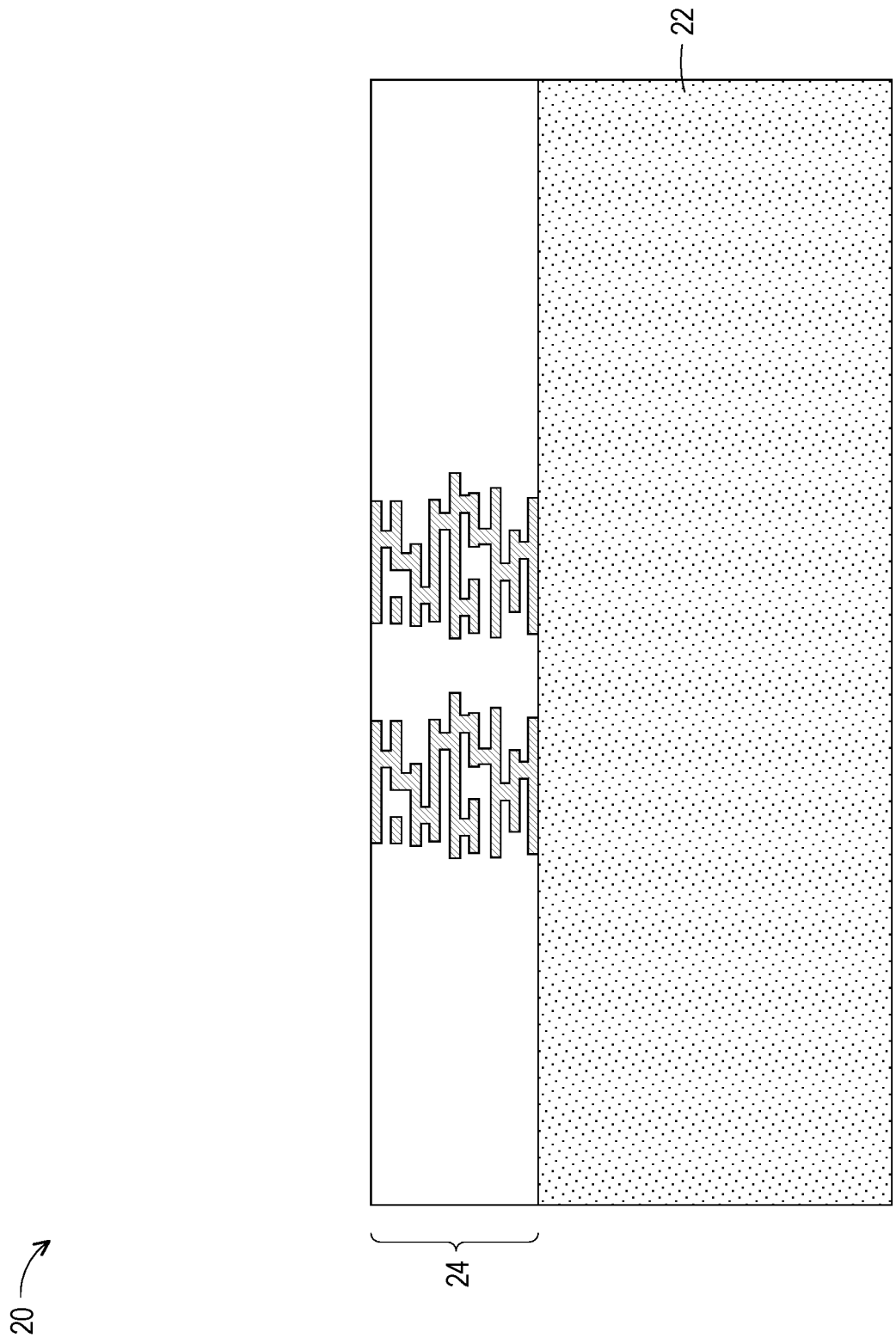
FIGS. 1 through 25 illustrate cross-sectional views of intermediate stages in the formation of a package according to some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a redistribution structure that can be integrated into a device (e.g., a chip or die) or a package (e.g., a chip-on-wafer (CoW) package structure or a wafer-on-wafer (WoW) package structure). The redistribution structure includes a redistribution via and line with a level or flat upper surface to allow for a smaller pitch and minimum distance between adjacent redistribution lines and bond pads and bond pad vias. In some embodiments, the redistribution via and line are formed in a same process, for example, a dual damascene process. In some embodiments, warpage layers and bonding layers with high modulus and high thermal conductivity are formed over the redistribution line and improve the warpage control and heat dissipation. In addition, the ratio of the thickness of the bond pad vias to bond pads is smaller than conventional bond pad vias and bond pads. By having this smaller ratio of thicknesses, the electrical and thermal conductivity of the structure is improved.

Further, the teachings of this disclosure are applicable to any redistribution structures where a flat top surface of a redistribution via and/or pad can reduce the minimum pitch of the redistribution structures. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the components may be sufficient to convey aspects of the embodiment. Further, method embodiments discussed herein may be discussed as being performed in a particular order; however, other method embodiments may be performed in any logical order.

FIGS. 1 through 26 illustrate cross-sectional views of intermediate stages in the formation of packages in accordance with some embodiments.

FIG. 1 illustrates a cross-sectional view of an integrated circuit die 20 in accordance with some embodiments. The integrated circuit die 20 will be packaged in subsequent processing to form an integrated circuit package. The integrated circuit die 20 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 20 may be formed in a wafer, which may include different device regions that are singulated in subsequent steps to form a plurality of integrated circuit dies. The integrated circuit die 20 may be processed according to applicable manufacturing processes to form integrated circuits. For example, the integrated circuit die 20 includes a substrate 22, such as silicon, doped or undoped, or an active layer of a semiconductor-on-insulator (SOI) substrate. The substrate 22 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 22 has an active surface (e.g., the surface facing upwards in FIG. 1), sometimes called a front side, and an inactive surface (e.g., the surface facing downwards in FIG. 1), sometimes called a back side.

Devices (not shown) may be formed at the front surface of the substrate 22. The devices may be active devices (e.g., transistors, diodes, etc.), capacitors, resistors, the like, or a combination thereof. An inter-layer dielectric (ILD) (not separately illustrated) is over the front surface of the substrate 22. The ILD surrounds and may cover the devices. The ILD may include one or more dielectric layers formed of materials such as Phospho-Silicate Glass (PSG), Boro-Silicate Glass (BSG), Boron-Doped Phospho-Silicate Glass (BPSG), Undoped Silicate Glass (USG), or the like.

Conductive plugs (not separately illustrated) extend through the ILD to electrically and physically couple the devices. For example, when the devices are transistors, the conductive plugs may couple the gates and source/drain regions of the transistors. The conductive plugs may be formed of tungsten, cobalt, nickel, copper, silver, gold, aluminum, the like, or combinations thereof. An interconnect structure 24 is over the ILD and the conductive plugs. The interconnect structure 24 interconnects the devices to form an integrated circuit. The interconnect structure 24 may be formed by, for example, metallization patterns in dielectric layers on the ILD. The metallization patterns include metal lines and vias formed in one or more low-k dielectric layers. The metallization patterns of the interconnect structure 24 are electrically coupled to the devices by the conductive plugs. The metallization patterns may be formed using any suitable process, such as a single damascene process, a dual damascene process, a plating process, combinations thereof, or the like.

Figure 2:
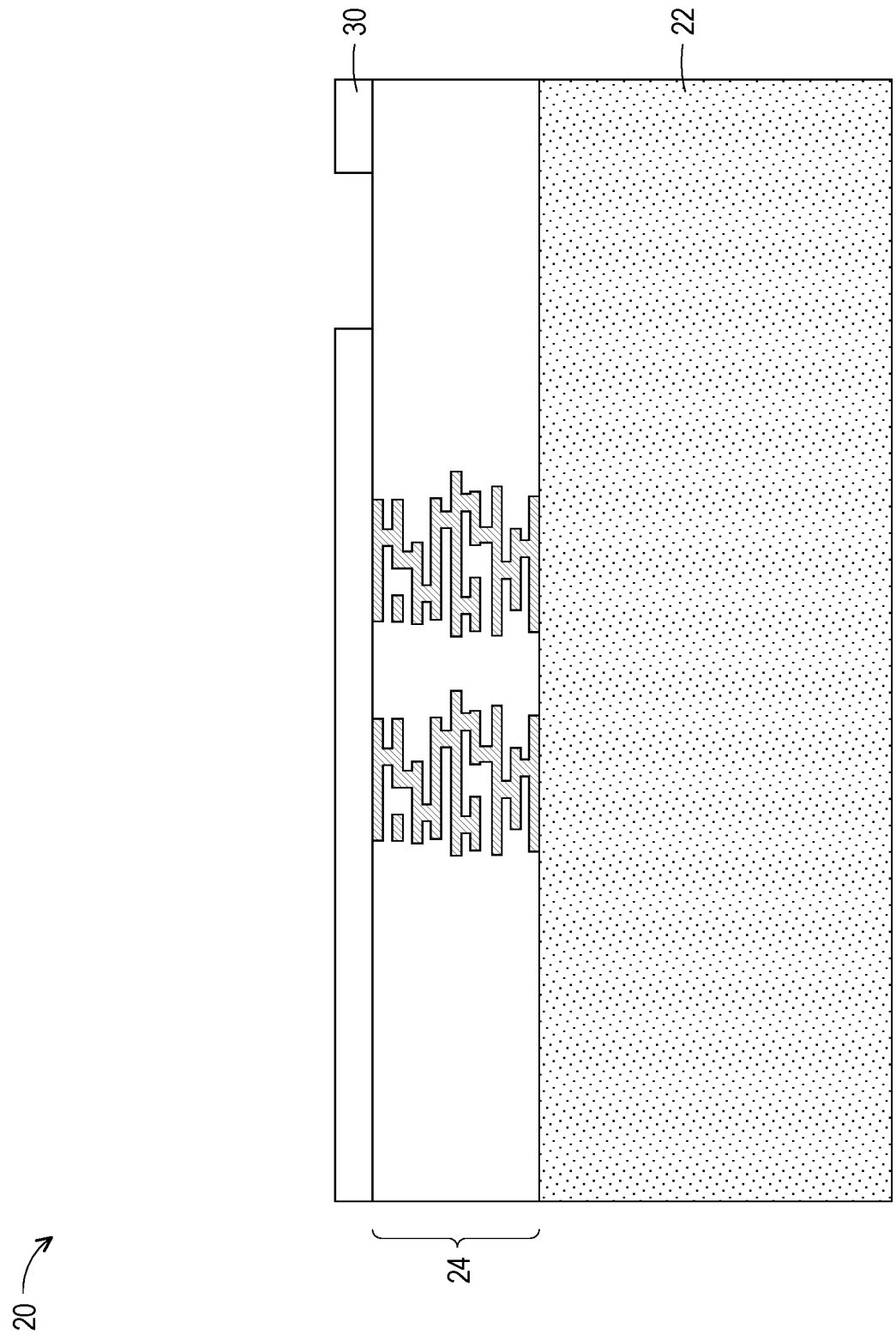

After forming the interconnect structure 24, as shown in FIG. 2, a mask 30 is formed and patterned on the interconnect structure 24. In some embodiments, the mask 30 is a photoresist and may be formed by spin coating or the like and may be exposed to light for patterning. The pattern of the photoresist corresponds to an upper portion of the subsequently formed through substrate via (TSV) 44 (see, e.g., FIG. 6). The patterning forms at least one opening through the photoresist 30 to expose the interconnect structure 24. In some embodiments, a stop layer (not shown), such as a chemical mechanical polishing (CMP) stop layer is deposited over a top surface of the interconnect structure 24 before the mask 30. The CMP stop layer may be used to prevent a subsequent CMP process from removing too much material by being resistant to the subsequent CMP process and/or by providing a detectable stopping point for the subsequent CMP process. In some embodiments, the CMP stop layer may comprise one or more layers of dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like, and may be formed using spin-on coating, chemical vapor deposition (CVD), plasma-enhanced CVD (PECVD), atomic layer deposition (ALD), the like, or a combination thereof.

Figure 3:
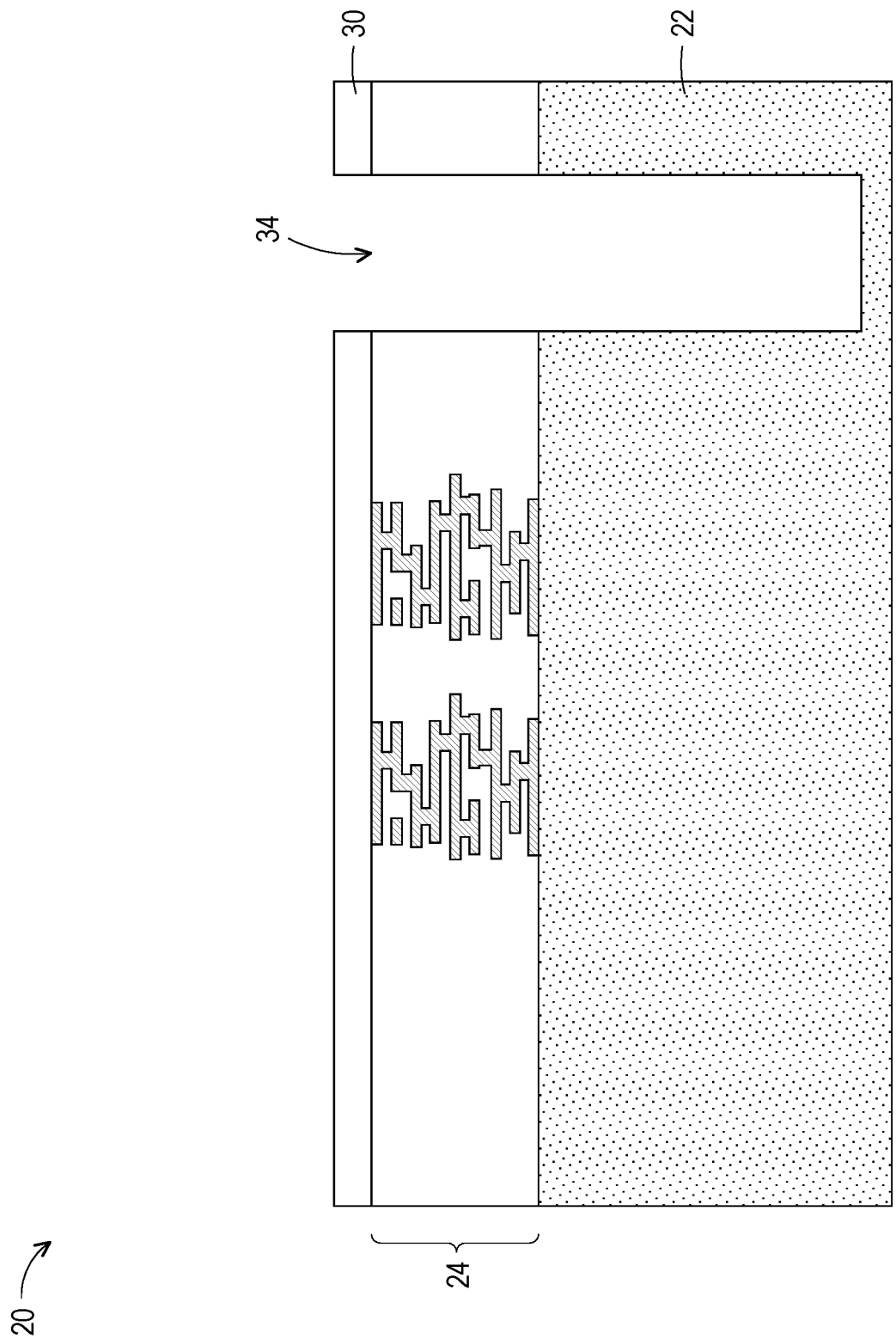

In FIG. 3, the remaining mask 30 is used as a mask during an etching process to remove exposed and underlying portions of the dielectric layer(s) of the interconnect structure 24 and the substrate 22. A single etch process may be used to etch an opening 34 in the interconnect structure 24 and the substrate 22 or a first etch process may be used to etch the interconnect structure 24 and a second etch process may be used to etch the substrate 22. In some embodiments, the opening 34 is formed with a plasma dry etch process, a reactive ion etch (RIE) process, such as a deep RIE (DRIE) process. In some embodiments, the DRIE process includes etch cycle(s) and passivation cycle(s) with the etch cycle(s) using, for example, $SF_6$, and the passivation cycle(s) using, for example, $C_4F_8$. The utilization of a DRIE process with the passivation cycle(s) and the etch cycle(s) enables a highly anisotropic etching process. In some embodiments, the etch process(es) may be any acceptable etching process, such as by wet or dry etching.

Figure 4:
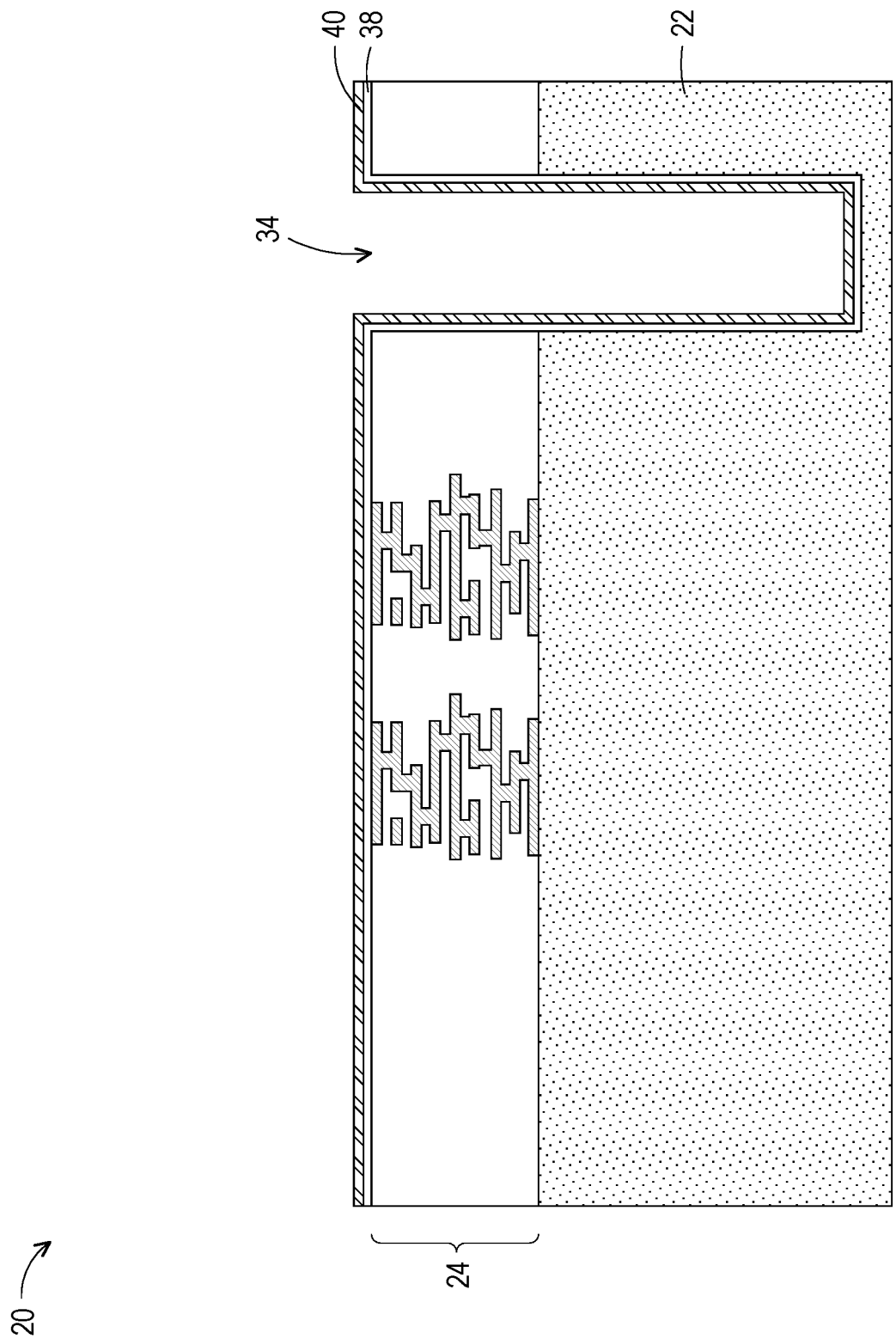

As illustrated in FIG. 4, after forming the opening 34, the photoresist 30 is removed. The photoresist 30 may be removed by an acceptable ashing or stripping process, such as using an oxygen plasma or the like.

Further in FIG. 4, a liner layer 38 is conformally deposited on the interconnect structure 24 and on the bottom surface and sidewalls of the opening 34. In some embodiments, the liner layer 38 includes one or more layers of dielectric materials and may be used to physically and electrically isolate the subsequently formed through vias from the substrate 22. Suitable dielectric materials may include oxides (such as silicon oxide, aluminum oxide, or the like), nitrides (such as SiN, or the like), oxynitrides (such as SiON, or the like), combinations thereof, or the like. The liner layer 38 may be formed using CVD, PECVD, ALD, the like, or a combination thereof.

In a subsequent step, as shown in FIG. 4, a seed layer 40 is formed over liner layer 38. In some embodiments, the seed layer 40 is a metal layer, which may be a single layer or a composite layer comprising a plurality of sub-layers formed of different materials. In some embodiments, the seed layer 40 comprises a titanium layer and a copper layer over the titanium layer. The seed layer may be formed using, for example, physical vapor deposition (PVD) or the like. In some embodiments, a barrier layer (not shown) may be formed on the liner layer 38 prior to forming the seed layer 40. The barrier layer may comprise Ti, TiN, the like, or a combination thereof.

Figure 5:
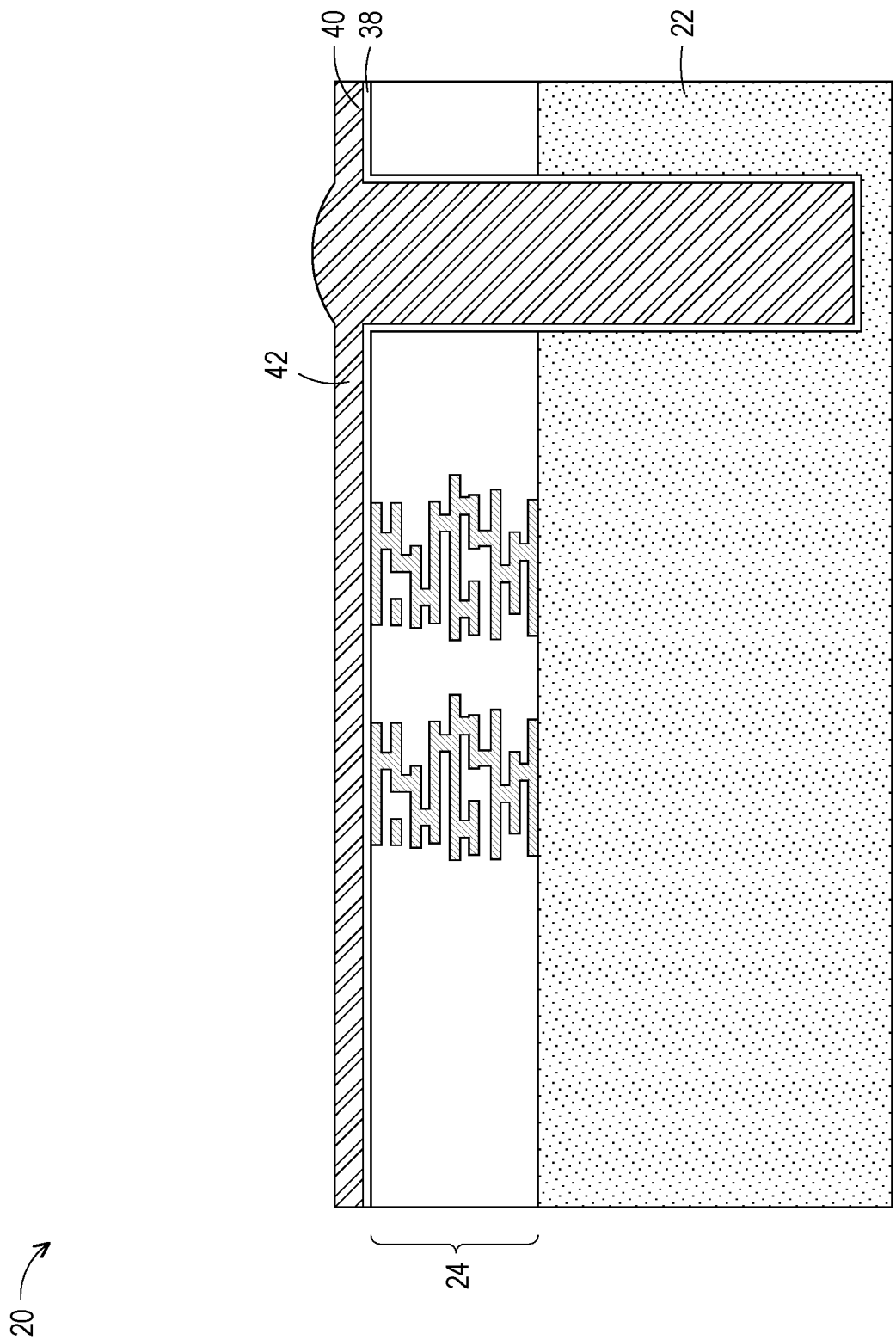

In FIG. 5, a conductive material 42 is formed on the seed layer 40 and fills the opening 34. The conductive material 42 may be formed by plating, such as electroplating including electrochemical plating, electroless plating, or the like. The conductive material may comprise a metal, like copper, titanium, tungsten, aluminum, or the like.

After the conductive material 42 is formed, an anneal process is then performed. The anneal process may be performed to prevent subsequent extrusion of the conductive material of the TSV 44 (sometime referred to as TSV pumping). The TSV pumping is caused by a coefficient of thermal expansion (CTE) mismatch between the conductive material 42 and the substrate 22 and can cause damage to structures (e.g., metallization patterns) over the TSV.

Figure 6:
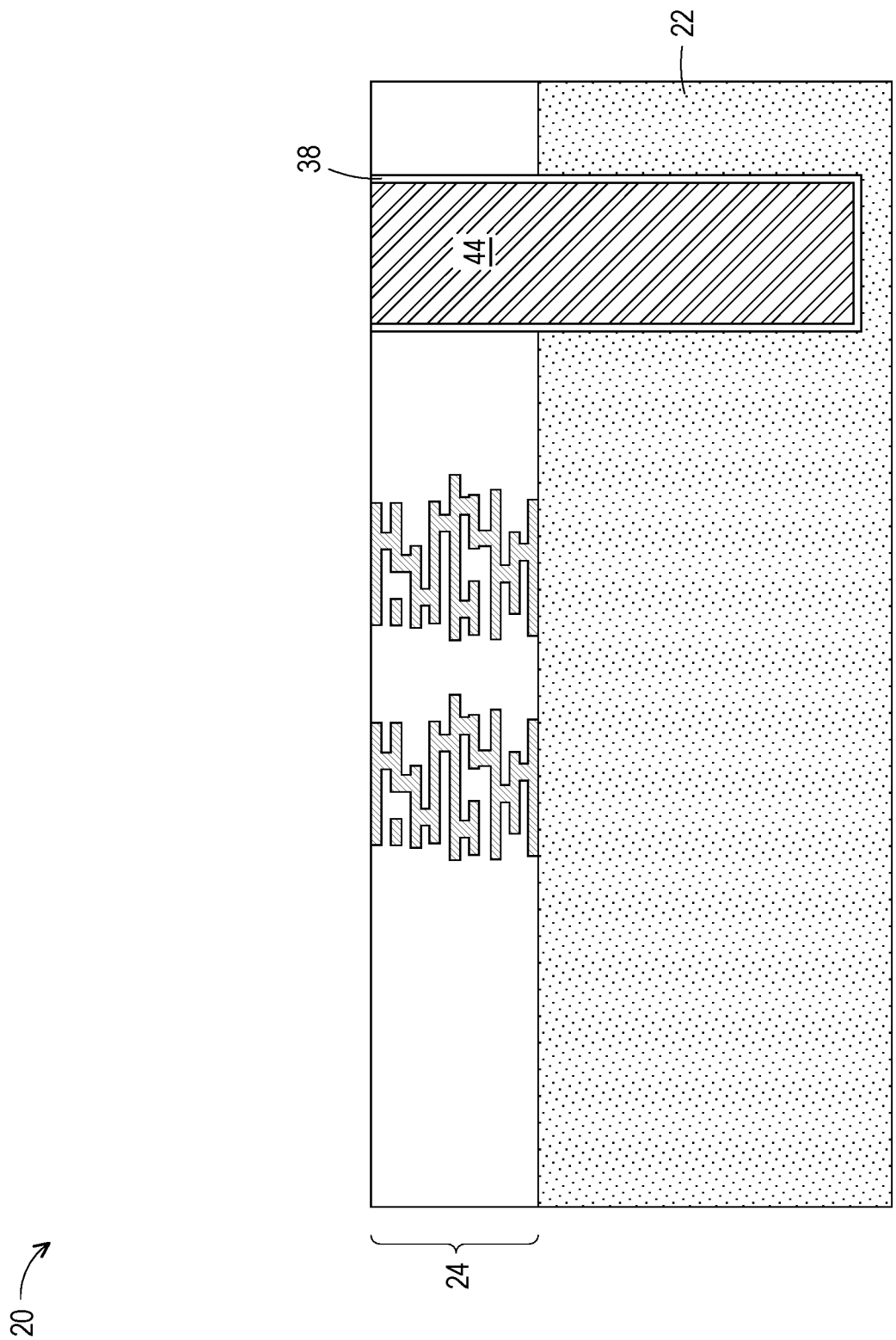

Following the anneal process, a planarization process is performed to remove portions of the conductive material 42, the seed layer 40, and the liner layer 38 outside the openings 34 to form a TSV 44 as illustrated in FIG. 6. Top surfaces of the TSV 44 and the topmost dielectric layer of the interconnect structure 24 are coplanar after the planarization process within process variations. The planarization process may be, for example, a chemical-mechanical polish (CMP), a grinding process, or the like. The upper portion of the TSV 44 (formed in the interconnect structure 24) has a greater width than the lower portion of the TSV 44 (formed in the substrate 22).

Figure 7:
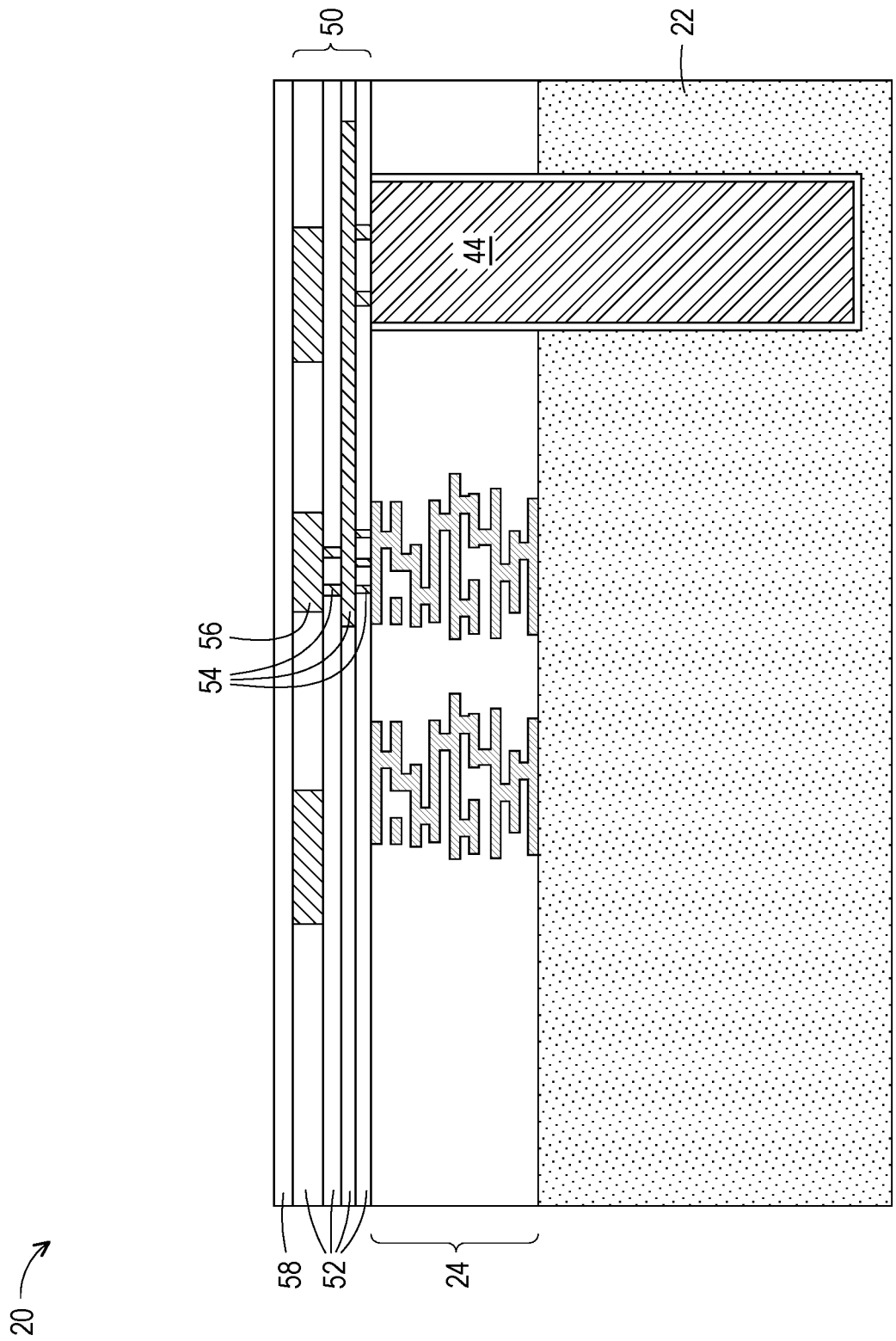
Figure 14:
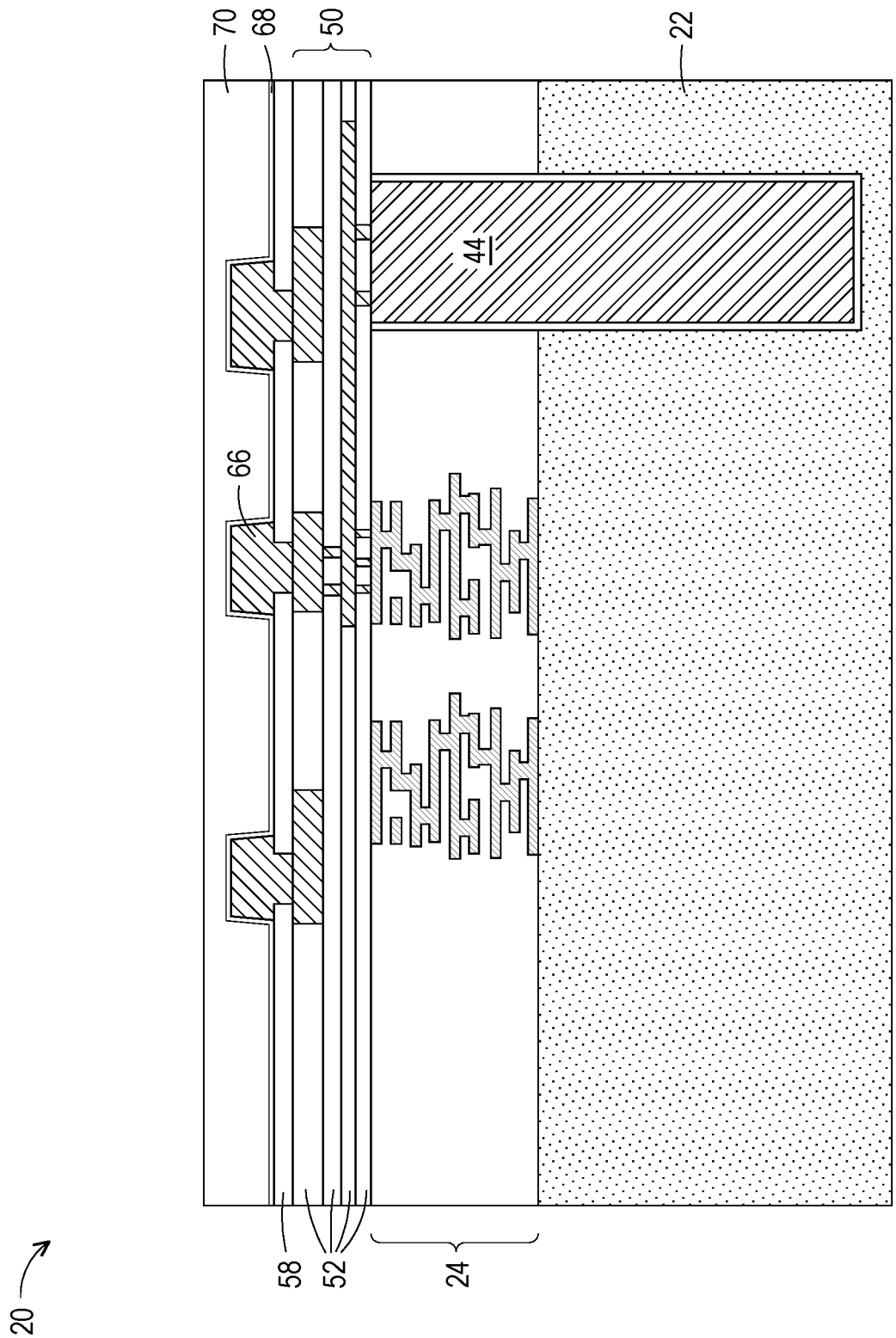

Referring to FIG. 7, an interconnect structure 50 is formed over the structure of FIG. 6. The interconnect structure 50 includes dielectric layers 52, metallization patterns and vias 54, and top metal 56. More or fewer dielectric layers and metallization patterns and vias may be formed than is shown in FIG. 14. The interconnect structure 50 is connected to the interconnect structure 24 and TSV 44 by metallization patterns and vias formed in the dielectric layer(s) 52. The metallization patterns and vias may be formed using similar processes and materials as the interconnect structure 24 and the description is not repeated herein. In some embodiments, there are more than one layer of top metal 56, such as two top metal layers.

In some embodiments, the dielectric layers 52 are a same material as the dielectric layers of the interconnect structure 24, e.g., low-k dielectric. In other embodiments, the dielectric layers 52 are formed of a silicon-containing oxide (which may or may not include oxygen). For example, the dielectric layers 52 may include an oxide such as silicon oxide, a nitride such as silicon nitride, or the like.

The metallization patterns and vias 54 and the top metal 56 may be formed using any suitable process, such as a single damascene process, a dual damascene process, a plating process, combinations thereof, or the like. An example of forming the metallization patterns and vias 54 and the top metal 56 by a damascene process includes etching dielectric layers 52 to form openings, depositing a conductive barrier layer into the openings, plating a metallic material such as copper or a copper alloy, and performing a planarization to remove the excess portions of the metallic material. In other embodiments, the formation of the dielectric layers 52, the metallization patterns and vias 54, and the top metal 56 may include forming the dielectric layer 52, patterning the dielectric layer 52 to form openings, forming a metal seed layer (not shown), forming a patterned plating mask (such as photoresist) to cover some portions of the metal seed layer, while leaving other portions exposed, plating the metallization patterns and vias 54 and the top metal 56, removing the plating mask, and etching undesirable portions of the metal seed layer. The metallization patterns and vias 54 and top metal 56 may be made of tungsten, cobalt, nickel, copper, silver, gold, aluminum, the like, or combinations thereof. In some embodiments, the top metal 56 is thicker than the metallization patterns 54, such as three times thicker, five times thicker, or any suitable thickness ratio between the metallization layers.

FIG. 7 further illustrates the formation of a passivation layer 58 over the dielectric layers 52. In some embodiments, the passivation layer 58 is formed of a same material as the dielectric layers 52. In some embodiments, the passivation layer 58 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like; or a combination thereof. The passivation layer 58 may be formed, for example, by spin coating, lamination, chemical vapor deposition (CVD), or the like. The passivation layer 58 may have an upper surface that is substantially level within process variations.

Figure 8:
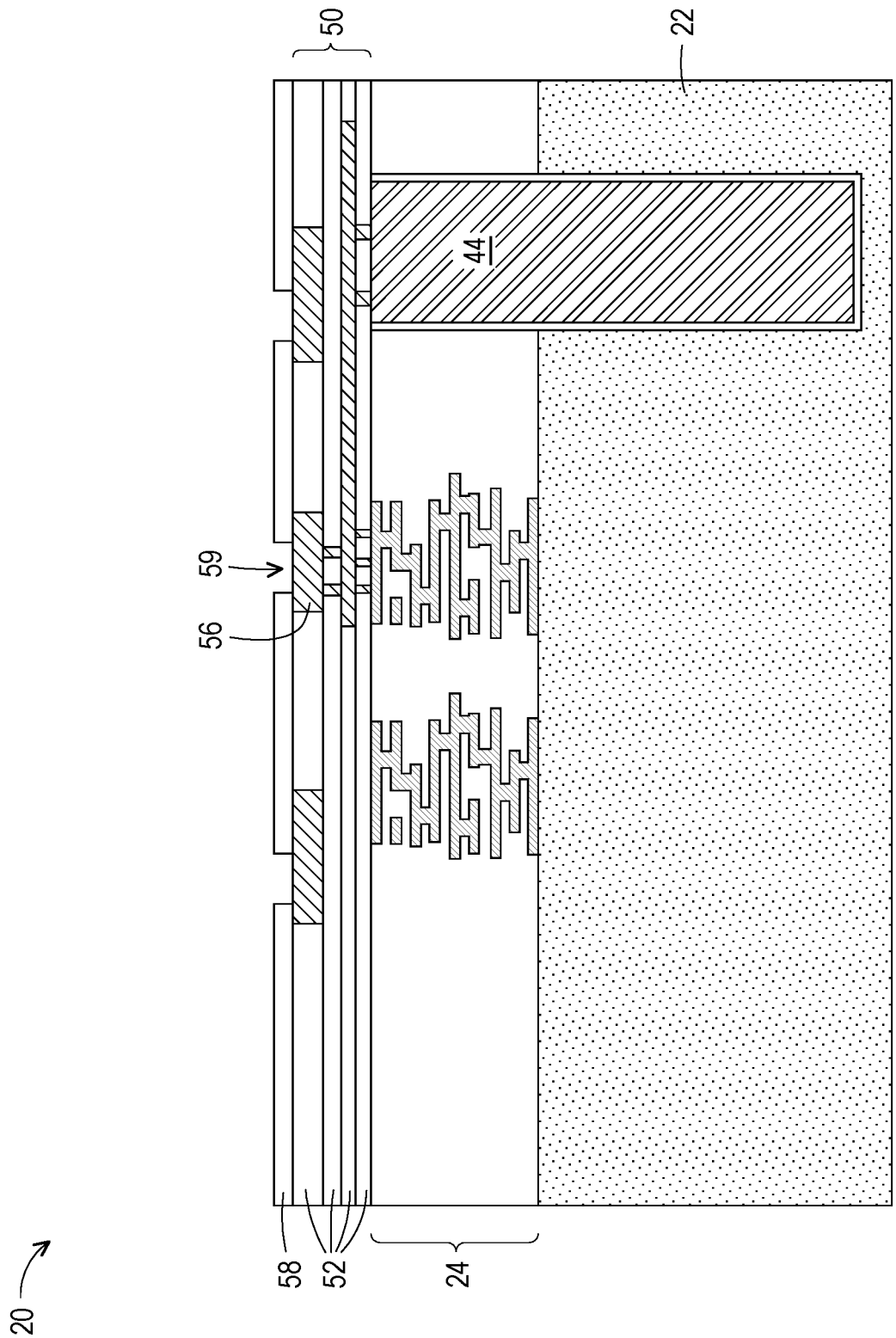

In FIG. 8, openings 59 are formed through the passivation layer and expose surfaces of the top metal 56. The openings may be formed by any suitable process such as an etch process.

Figure 9:
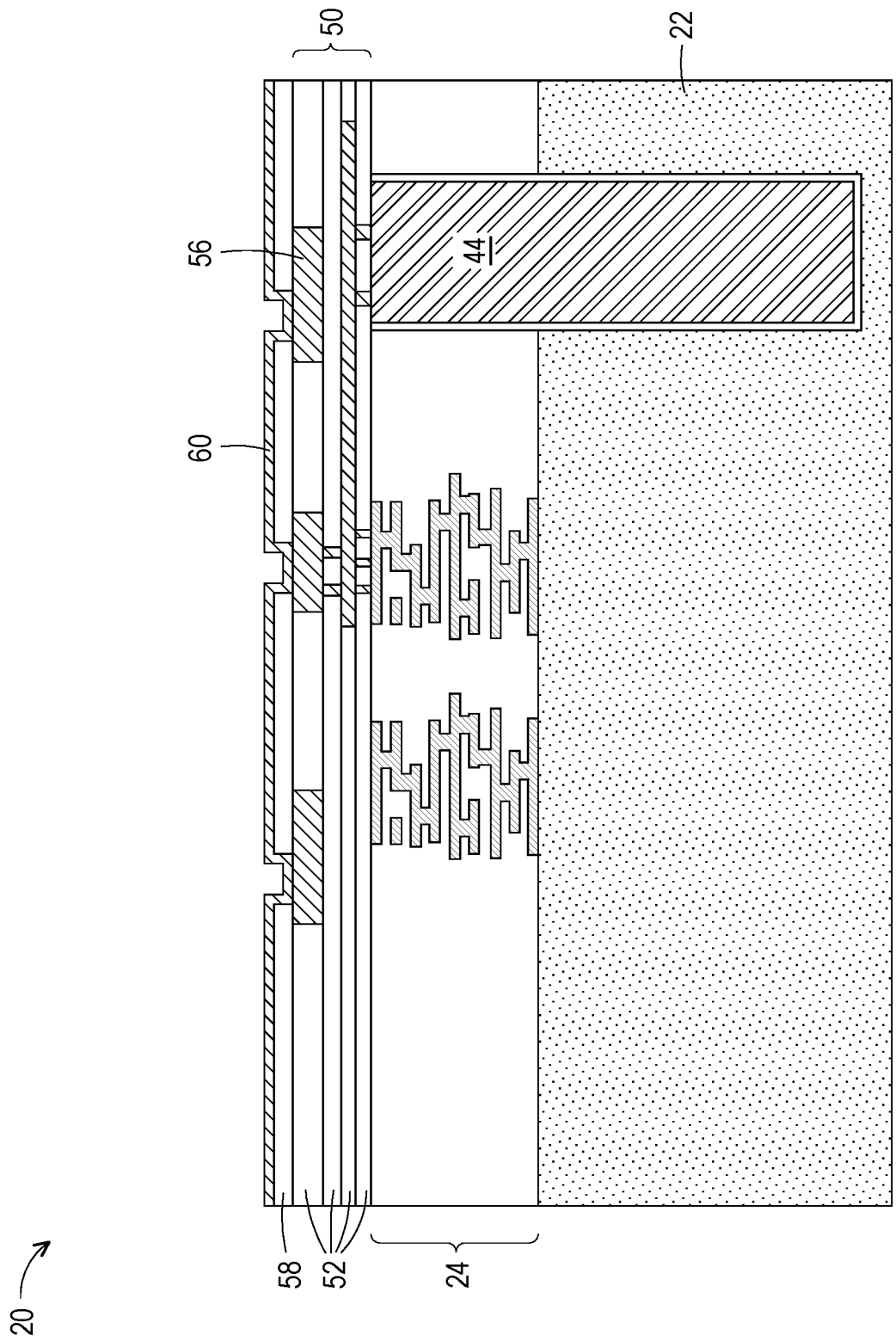

In FIG. 9, a seed layer 60 is formed over the passivation layer 58, in the openings 59, and on exposed portions of the top metal 56 in the openings 59. In some embodiments, the seed layer 60 is a metal layer, which may be a single layer or a composite layer comprising a plurality of sub-layers formed of different materials. In some embodiments, the seed layer 60 comprises a titanium layer and a copper layer over the titanium layer. The seed layer may be formed using, for example, PVD or the like. In some embodiments, a barrier layer (not shown) may be formed prior to forming the seed layer 60. The barrier layer may comprise Ti, TiN, the like, or a combination thereof.

Figure 10:
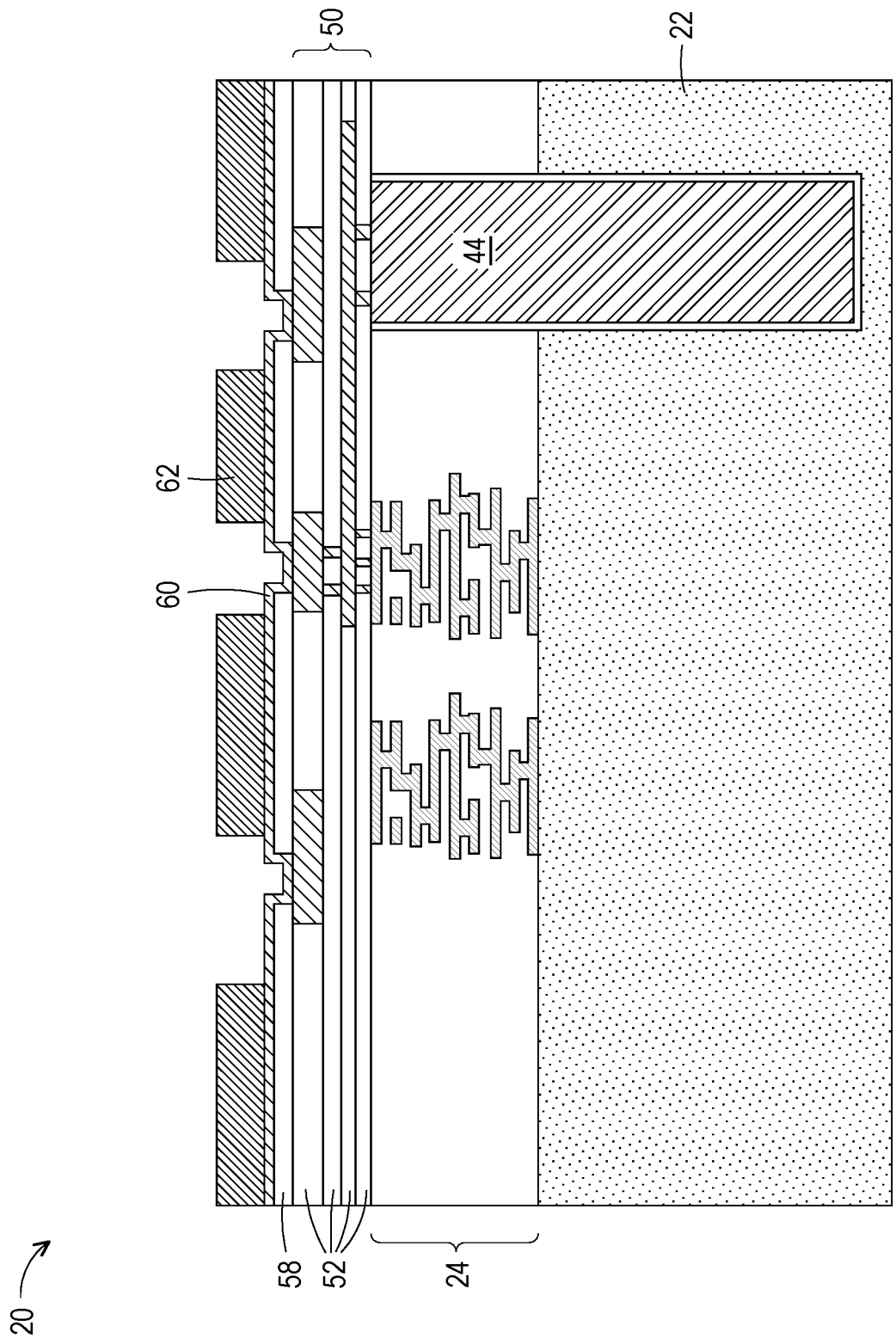

In FIG. 10, a photoresist 62 is formed and patterned over the seed layer 60. The photoresist 62 may be formed by spin coating or the like and may be exposed to light for patterning. The pattern of the photoresist corresponds to the redistribution pads 66 (see FIG. 12).

Figure 11:
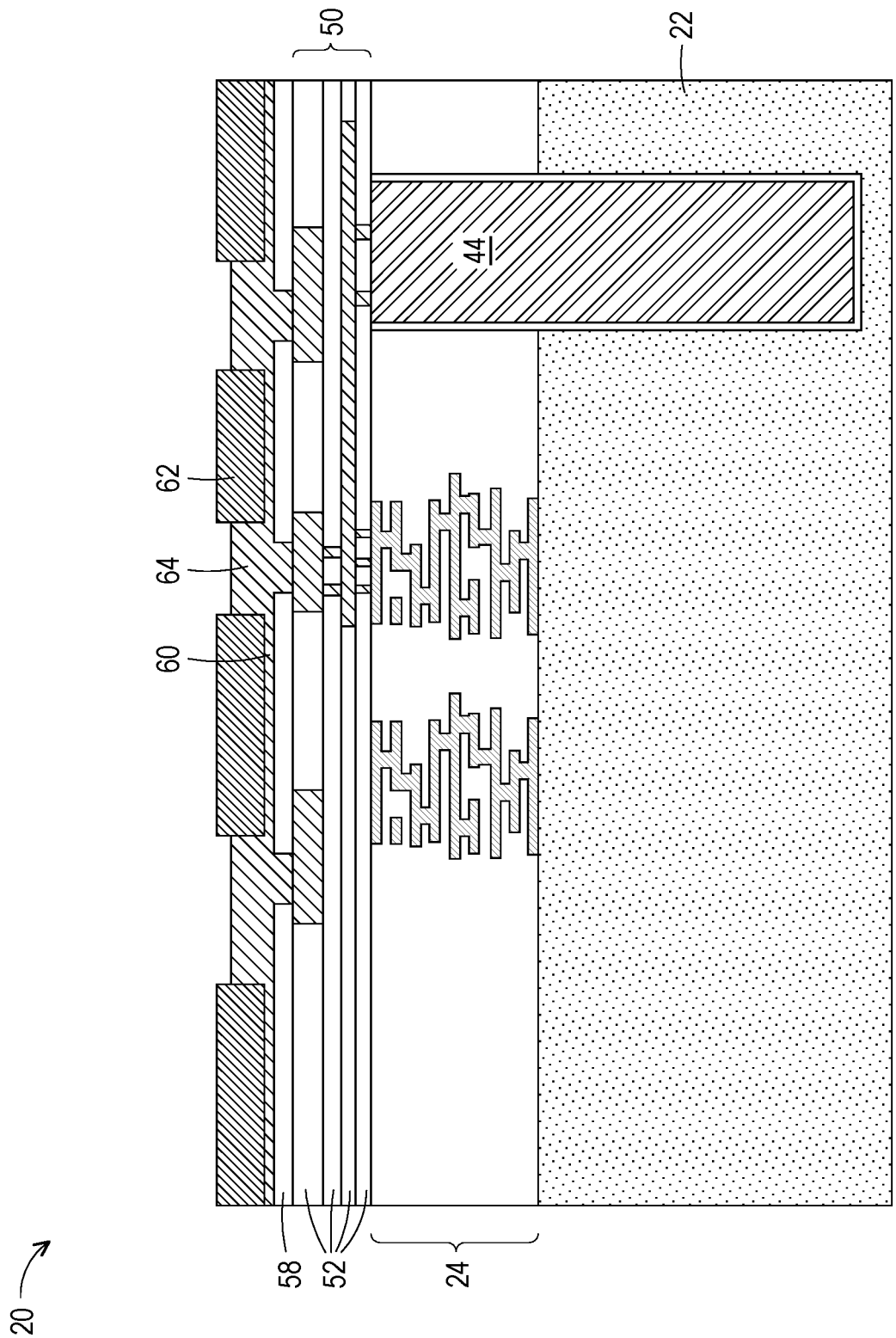

In FIG. 11, a conductive material 64 is formed on the exposed seed layer 60 in the openings of the photoresist 62. The conductive material 64 is formed on the seed layer 60 and fills the via openings 59. The conductive material 64 may be formed by plating, such as electroplating including electrochemical plating, electroless plating, or the like. The conductive material may comprise a metal, like copper, titanium, tungsten, aluminum, or the like. In some embodiments, the electroplating process is a bottom-up plating process that results in a flat upper surface of the conductive material 64.

Figure 12:
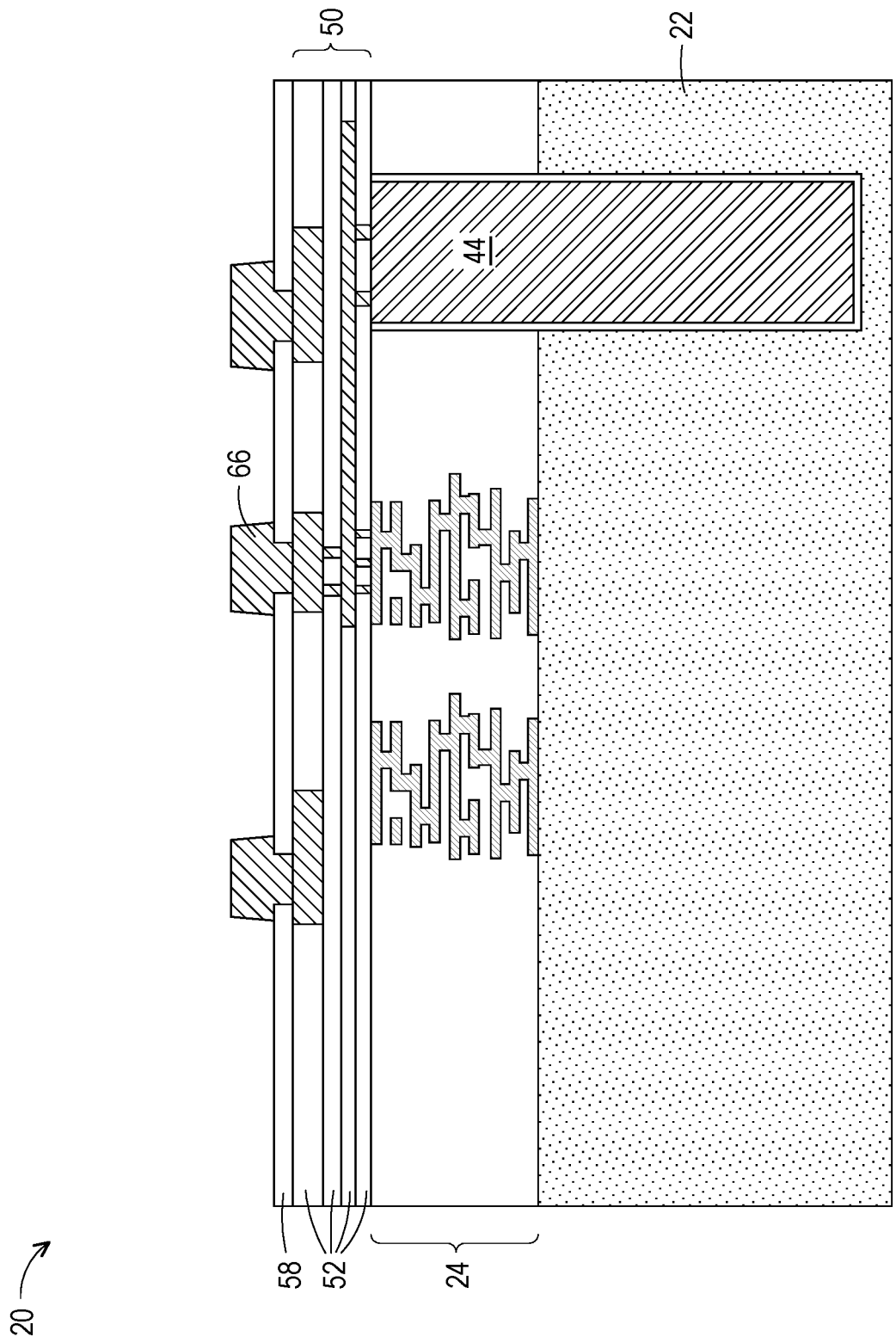

In FIG. 12, the photoresist 62 and underlying portion of the seed layer 60 are removed to form the redistribution pads and vias 66. The photoresist 62 may be removed by an acceptable ashing or stripping process, such as using an oxygen plasma or the like. The portions of the seed layer 60 may be removed by an acceptable etching process. Because the top surfaces of the passivation layer 58 are flat, the top surface of the redistribution pad 66 is flat or level. By having the top surface of the redistribution pad 66 with a flat or level surface, bond vias and bond pads overlying the pad can be formed directly over the redistribution via and can have a reduced minimum pitch.

Figure 13:
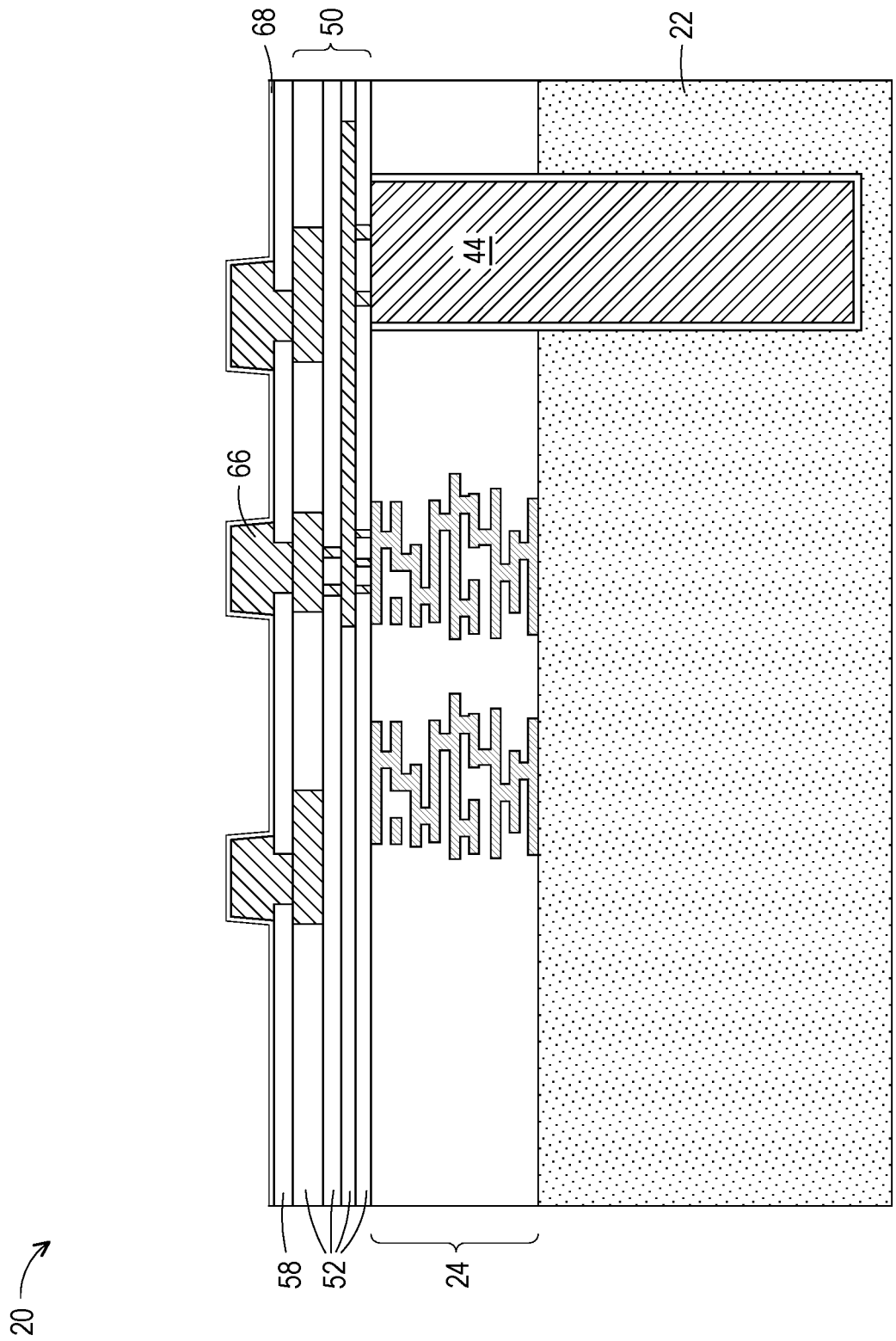

In FIG. 13, a dielectric layer 68 is formed over the passivation layer 58 and the redistribution pads 66. In some embodiments, the dielectric layer 68 is a conformal layer. The dielectric layer 68 may provide etch stop functions for the subsequently formed via openings for the bond vias (see, e.g., FIG. 17) and may be considered an etch stop or a via define layer 68. In some embodiments, the dielectric layer 68 is formed of a silicon-containing layer. For example, the dielectric layer 68 may include an oxide such as silicon oxide, a nitride such as silicon nitride, an oxynitride such as silicon oxynitride, the like, or a combination thereof.

In FIG. 14, a dielectric layer 70 is formed over the dielectric layer 68. The dielectric layer 70 provides a planar top surface to form the subsequent layers on (see, e.g., FIG. 15) and may be considered a planarization dielectric layer 70. In some embodiments, the dielectric layer 70 is formed of a silicon-containing layer. For example, the dielectric layer 70 may include an oxide such as silicon oxide, a nitride such as silicon nitride, an oxynitride such as silicon oxynitride, the like, or a combination thereof. In some embodiments, the dielectric layer 70 has a different material composition than the dielectric layer 68 such that the dielectric layer 68 can be more easily detected during an etch process that etches through the dielectric layers 70 and 68. For example, the dielectric layer 68 may be formed of silicon nitride, and the dielectric layer 70 may be formed of silicon oxide.

Figure 15:
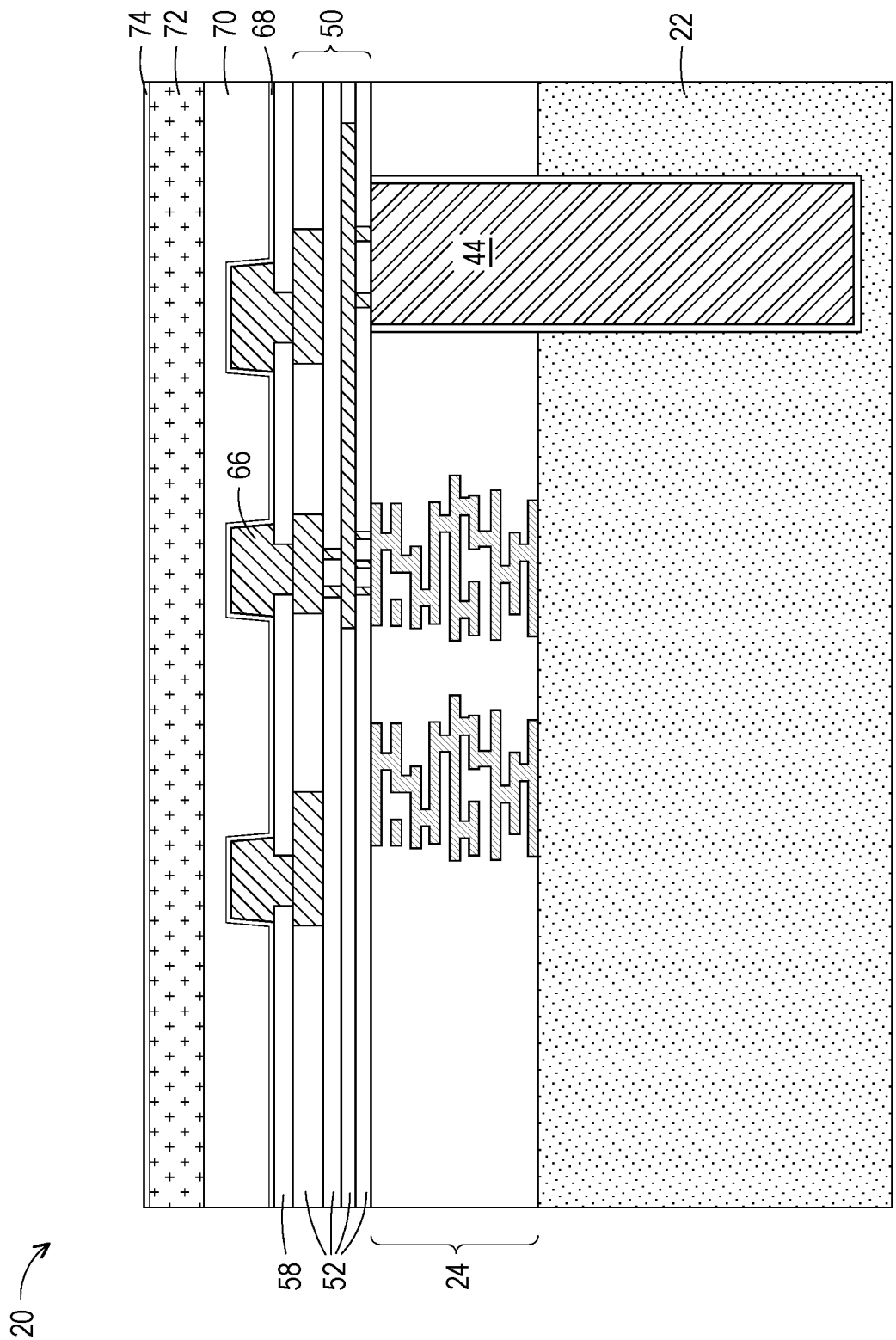

In FIG. 15, dielectric layers 72 and 74 are formed over the dielectric layer 70. The dielectric layer 72 may provide warpage control functions and may be considered a warpage control layer 72. The dielectric layer 74 may provide dielectric bonding functions and may be considered a bonding dielectric layer 74.

In some embodiments, the warpage control layer 72 and the bonding dielectric layer 74 may be formed of a high modulus and a high thermal conductivity material. In some embodiments, high modulus materials have a modulus of greater than 100 gigapascals (GPa). In some embodiments, high thermal conductivity materials have a thermal conductivity of greater than 2 watts per meter-Kelvin (W/m-K). Materials that are high modulus and high thermal conductivity include materials such as silicon nitride, silicon oxynitride, silicon carbide, silicon carbon nitride, silicon oxycarbide, the like, or combinations and sublayers thereof.

In some embodiments, the dielectric layer 72 has a different material composition than the dielectric layer 70 such that the dielectric layer 70 can be more easily detected during an etch process that etches through the dielectric layers 74 and 72. Although FIG. 15 illustrates three dielectric layers 70, 72, and 74, more or fewer than three dielectric layers may be formed (see, e.g., FIG. 29A-D).

By having warpage layers and bonding layers with high modulus and high thermal conductivity, the warpage control and heat dissipation of the structure is improved.

FIGS. 16 through 19 illustrate the formation of bond pad vias 86 and bond pads 88 in the dielectric layers 70, 72, and 74. The bond pad vias 86 and bond pads 88 may be formed using any suitable process, such as a single damascene process, a dual damascene process, combinations thereof, or the like. FIGS. 16 through 19 illustrate a dual damascene process.

Figure 16:
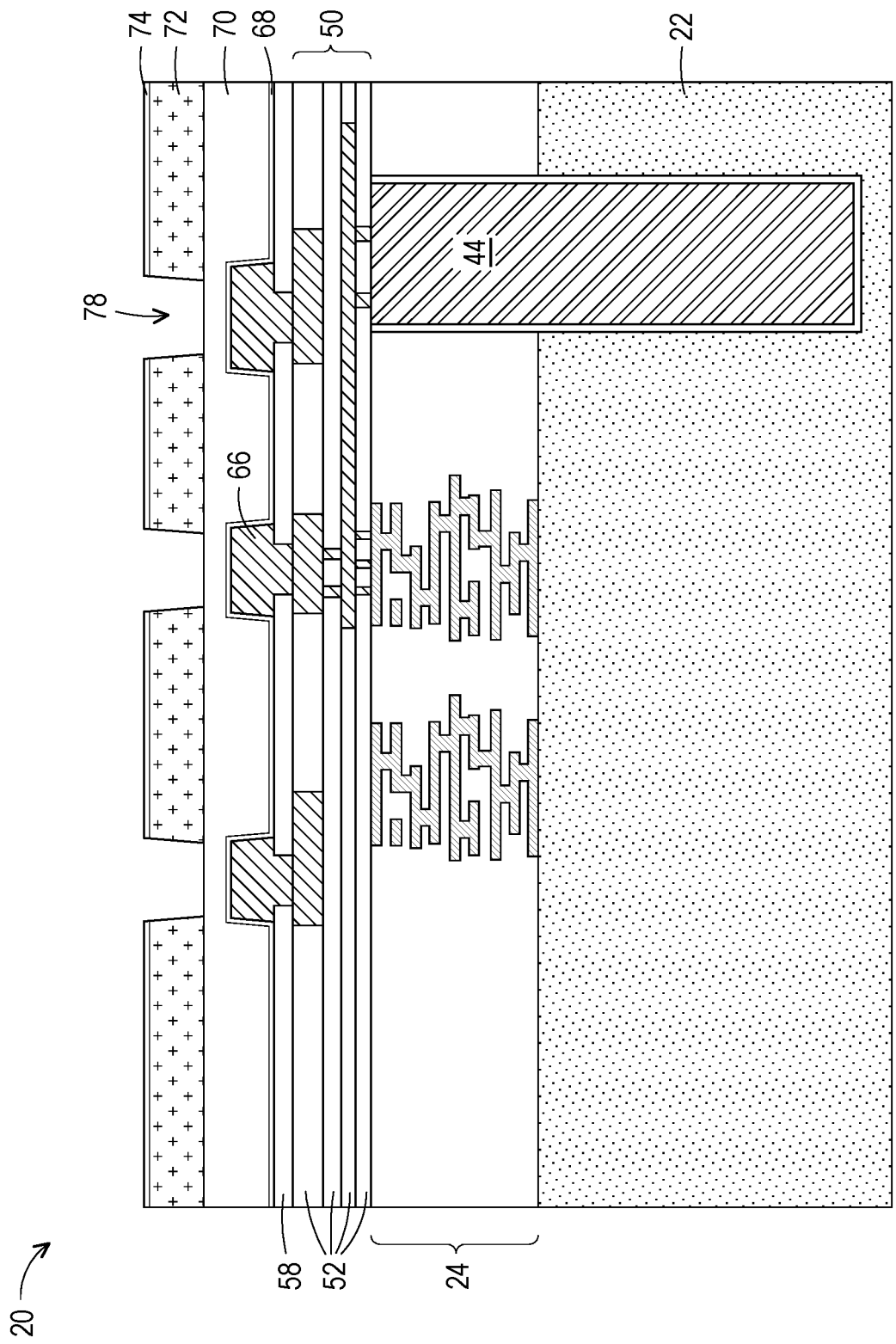

In FIG. 16, openings 78 are in the dielectric layers 74 and 72. In some embodiments, a photoresist (not shown) is formed and patterned on the dielectric layer 74. The photoresist may be formed by spin coating or the like and may be exposed to light for patterning. The pattern of the photoresist corresponds to openings 78 for the bond pads 88 (see FIG. 19). Further in FIG. 16, the dielectric layers 74 and 72 are patterned to form the openings 78 using the patterned photoresist as a mask with the patterning process stopping on the dielectric layer 70. The dielectric layer 70 is used to stop the etching process for the openings 78. The exposed portions of the dielectric layer 74 may be removed, such as by using an acceptable etching process, such as by wet and/or dry etching.

Figure 17:
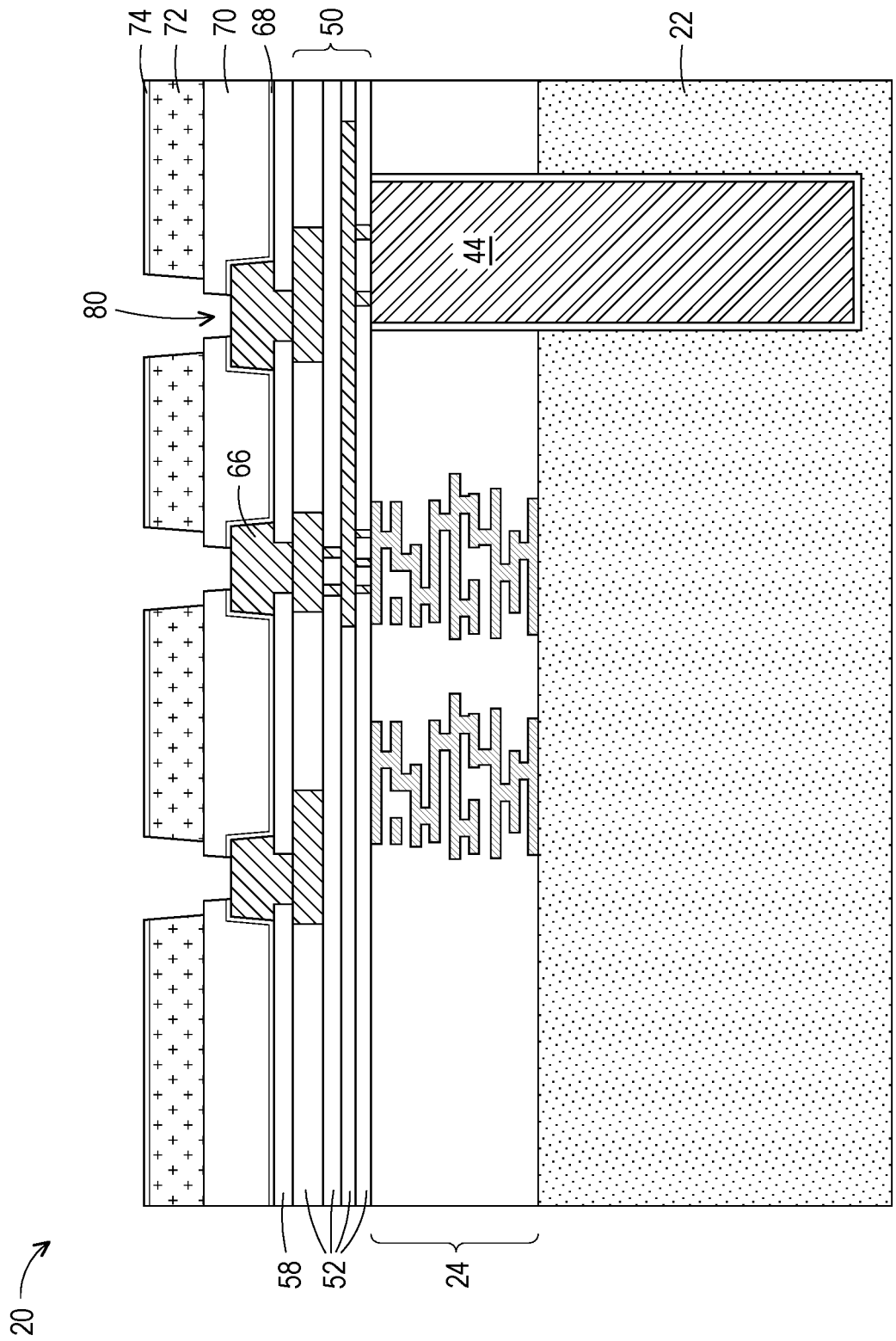

FIG. 17 illustrates the patterning of dielectric layer 70. The prior photoresist may be removed by an acceptable ashing or stripping process, such as using an oxygen plasma or the like. A new photoresist (not shown) may be formed and patterned on the patterned dielectric layer 74 and at least partially in the opening 78. The photoresist may be formed by spin coating or the like and may be exposed to light for patterning. The pattern of the photoresist corresponds to openings 80 for the bond pad vias 86 (see FIG. 19). Further in FIG. 17, the dielectric layer 70 is patterned to form the openings 80 using the patterned photoresist as a mask with the patterning process exposing portions of the redistribution pad 66. The exposed portions of the dielectric layer 70 may be removed, such as by using an acceptable etching process, such as by wet and/or dry etching.

Figure 18:
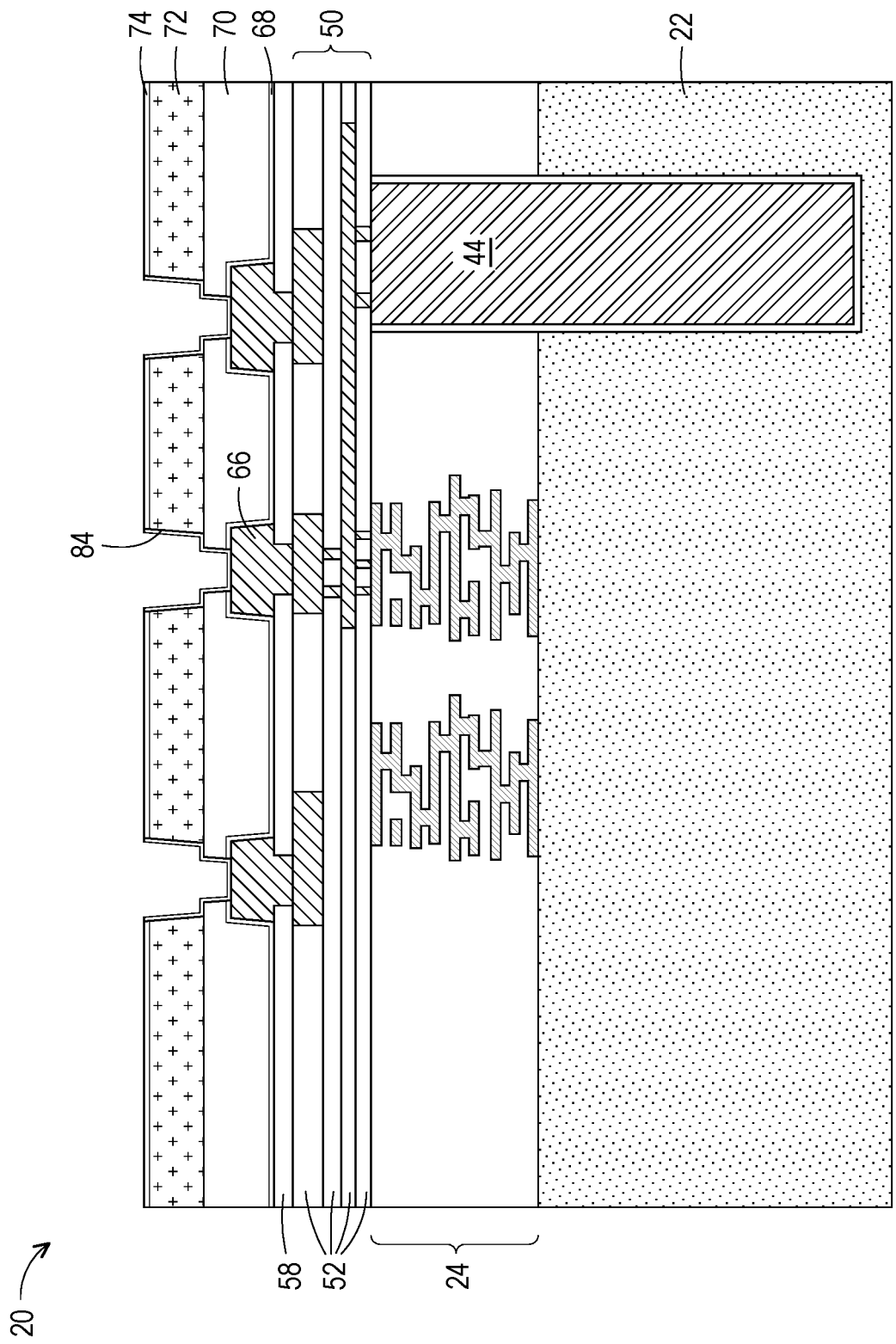

FIG. 18 illustrates the formation of a barrier layer 84 in the openings 78 and 80. In some embodiments, the barrier layer 84 may comprise Ti, TiN, the like, or a combination thereof. The barrier layer 84 may be formed in the openings prior to forming bond pad vias 86 and the bond pads 88.

Figure 19:
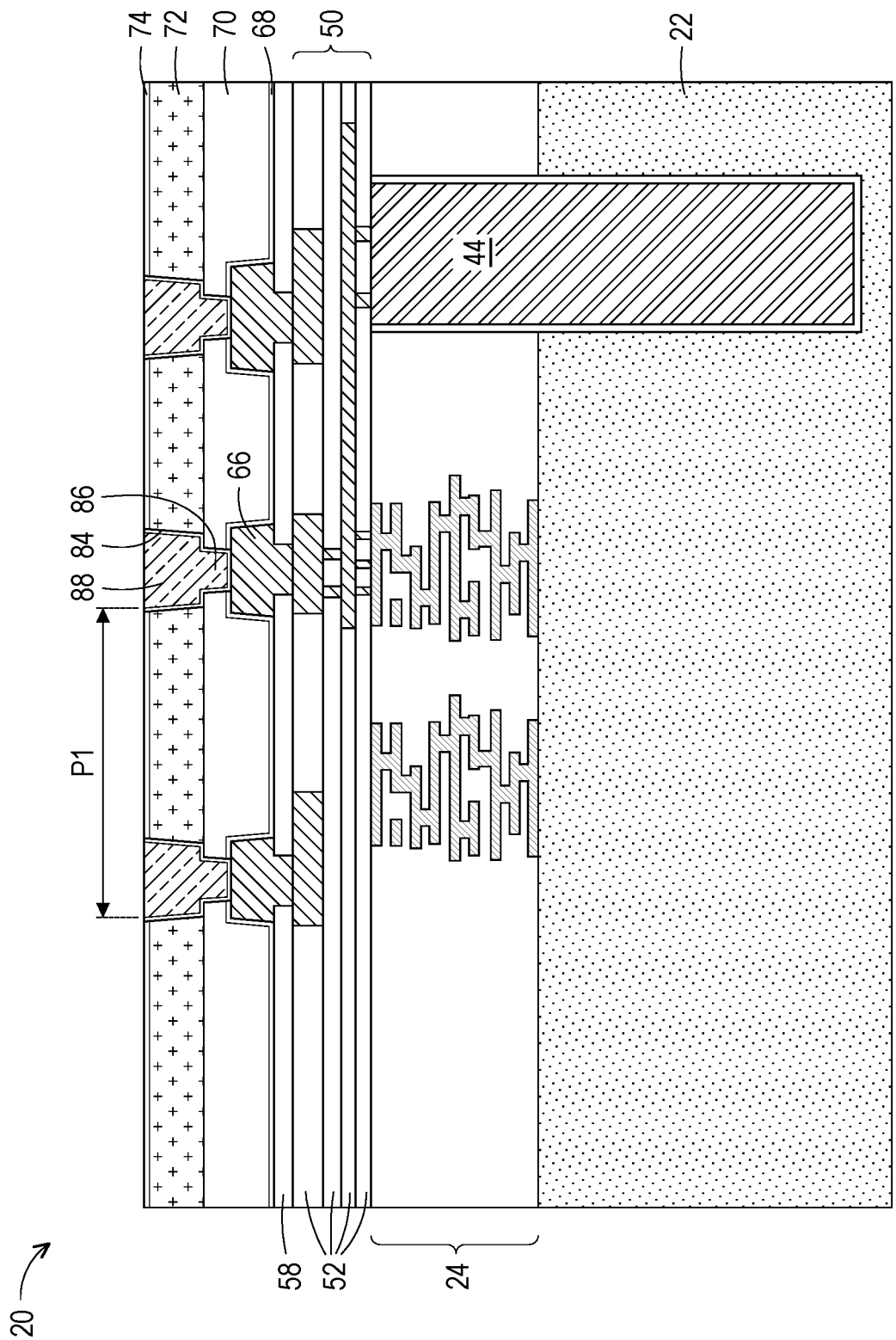

In FIG. 19, the bond pad vias 86 and the bond pads 88 may be formed on the barrier layer 84 in the openings 78 and 80. The bond pad vias 86 and the bond pads 88 may be formed by similar processes and materials as the metallization patterns and vias 54 and the redistribution pads vias and pads 66 and the description is not repeated herein. The bond pads 88 may be formed of or comprise copper, for example. Adjacent bond pads 88 have a pitch P1. In some embodiments, the pitch P1 is as small as 3.0 μm. In some embodiments, the pitch P1 is in a range from 3.0 μm to 5.4 μm. In accordance with embodiments with the bond vias and bond pads formed directly over (e.g., overlapping) the redistribution via 66, adjacent redistribution and bond structures can have a smaller minimum pitch.

The top surfaces of the bond pads 88 are coplanar with the top surface of the uppermost dielectric layer 74. The planarization is achieved through a chemical mechanical polishing (CMP) process or a mechanical grinding process.

Figure 20:
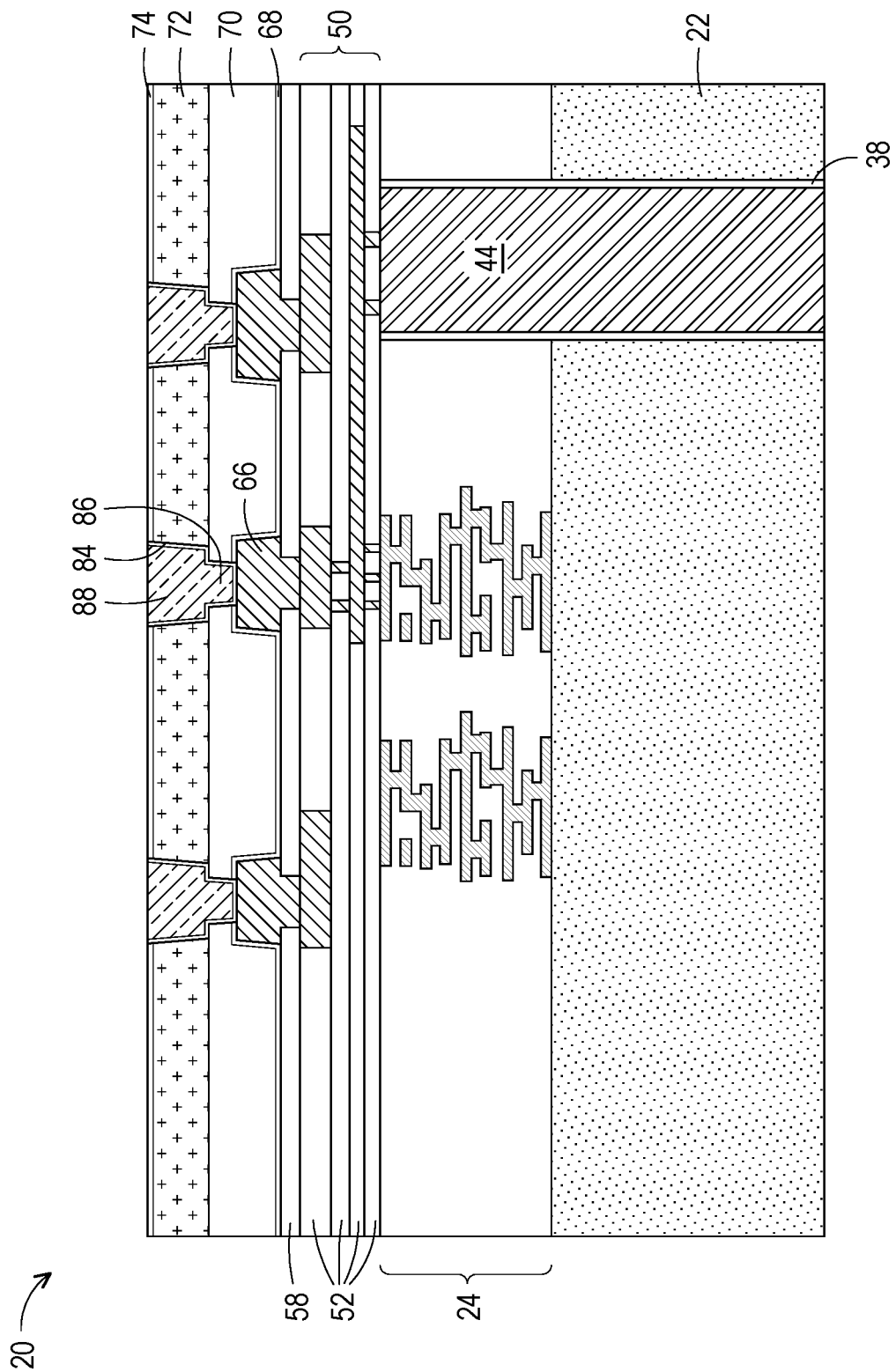

As shown in FIG. 20, the integrated circuit die 20 is thinned by thinning the substrate 22 before the subsequent singulation process. The thinning may be performed through a planarization process such as a mechanical grinding process or a CMP process. The thinning process exposes the TSV 44 and the liner 38. After thinning, the TSV 44 provides electrical connection from a back side of the substrate 22 to a front side of the substrate 22 (e.g., the interconnects 24 and 50 and bond pads 88).

Figure 21:
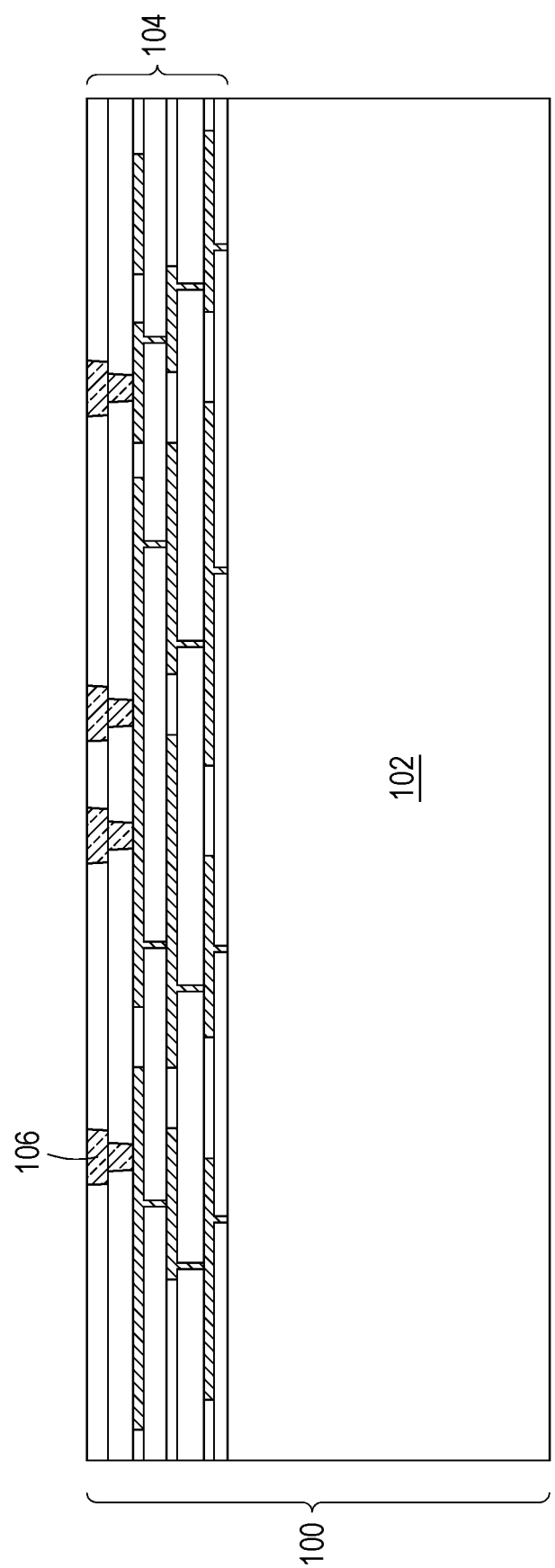

FIG. 21 illustrates a package structure 100. The package structure 100 includes a substrate 102, similar to the substrate 22 of the integrated circuit die 20, and an interconnect structure 104 including bond pads 106. The interconnect structure 104 and the bond pads 106 may be similar to the interconnect structures 24 and 50 and bond pads 88, respectively, described above and the descriptions are not repeated herein.

Figure 22:
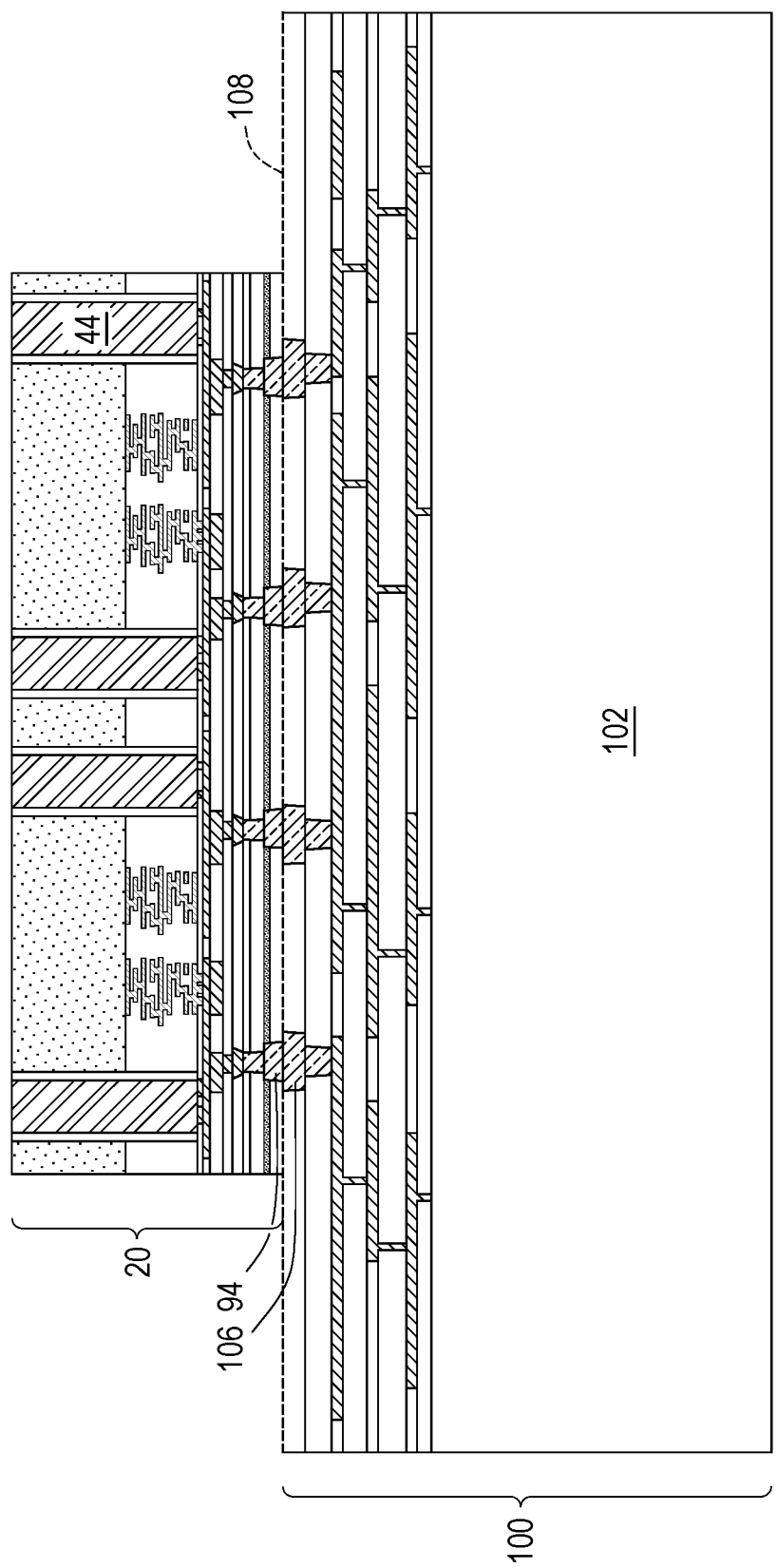

In FIG. 22, the integrated circuit die 20 is bonded to the package structure 100. The bonding of the integrated circuit die 20 to the package structure 100 may be achieved through direct bonding, in which both metal-to-metal direct bonding (between the bond pads 88 and 106) and dielectric-to-dielectric bonding (such as Si—O—Si bonding between surface dielectric layers of the integrated circuit die 20 and the package structure 100) are formed. Furthermore, there may be a single integrated circuit die 20 or a plurality of dies 20 bonded to the same package structure 100. The plurality of dies 20 bonded to the same package structure 100 may be identical to, or different from, each other to form a homogenous or a heterogeneous structure.

The die 20 is disposed face down such that the front sides of the die 20 face the package structure 100 and the back sides of the dies 20 face away from the package structure 100. The die 20 is bonded to the package structure 100 at an interface 108. As illustrated by FIG. 16, the direct bonding process directly bonds the topmost dielectric layer of the interconnect structure 104 of the package structure 100 to the topmost dielectric layer 74 of the die 20 at the interface 108 through fusion bonding. In an embodiment, the bond between the topmost dielectric layer of the interconnect structure 104 and the topmost dielectric layer 74 of the die 20 may be an oxide-to-oxide bond. The direct bonding process further directly bonds the bond pads 88 of the die 20 to the bond pads 106 of the package structure 100 at the interface 108 through direct metal-to-metal bonding. Thus, electrical connection between the die 20 and the package structure 100 is provided by the physical connection of the bond pads 88 to the bond pads 106.

As an example, the direct bonding process starts with aligning the die 20 with the package structure 100, for example, by aligning the bond pads 88 to the bond pads 106. When the die 20 and the package structure 100 are aligned, the bond pads 88 may overlap with the corresponding bond pads 106. Next, the direct bonding includes a pre-bonding step, during which the die 20 is put in contact with the package structure 100. The hybrid bonding process continues with performing an anneal, for example, at a temperature between about 150° C. and about 400° C. for a duration between about 0.5 hours and about 3 hours, so that the copper in the bond pads 88 and the bond pads 106 inter-diffuses to each other, and hence the direct metal-to-metal bonding is formed.

Figure 23:
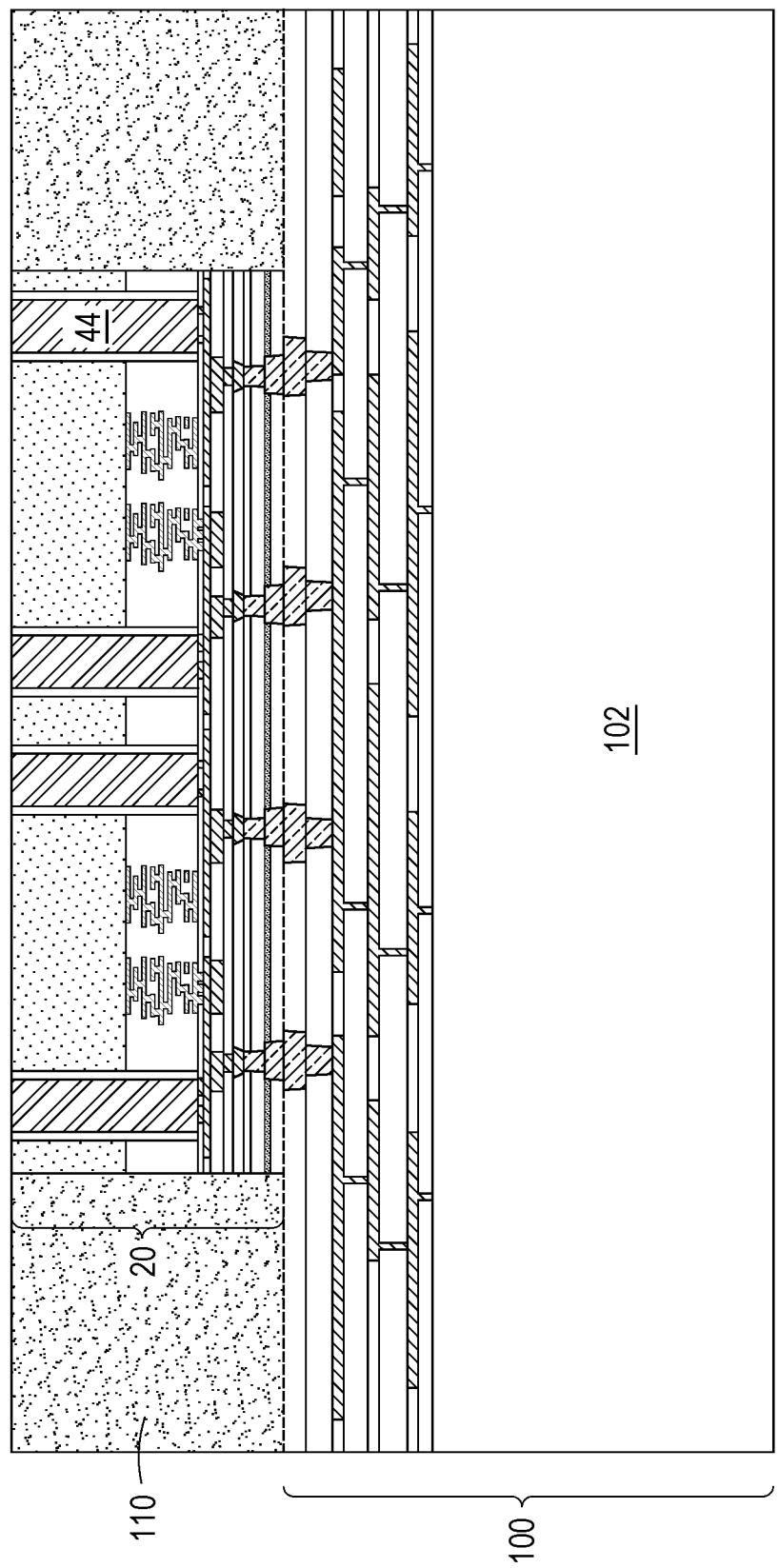

Next, as shown in FIG. 23, a gap-filling process is performed to encapsulate the integrated circuit die 20 in an encapsulant 110. After formation, the encapsulant 110 encapsulates the integrated circuit die 20. The encapsulant 110 may comprise an oxide. Alternatively, the encapsulant may be a molding compound, a molding underfill, a resin, an epoxy, or the like. The encapsulant 110 may be applied by compression molding, transfer molding, or the like, and may be applied in liquid or semi-liquid form and then subsequently cured. After the encapsulant 110 is deposited, a planarization process is performed to level a back-side surface of the integrated circuit die 20 with the top surface of the encapsulant 110 and to expose the TSVs 44. Surfaces of the TSVs 44, the substrate 22, and the encapsulant 110 are coplanar after the planarization process within process variations. The planarization process may be, for example, a CMP a grinding process, or the like. In some embodiments, the planarization may be omitted, for example, if the TSVs 44 are already exposed.

Figure 24:
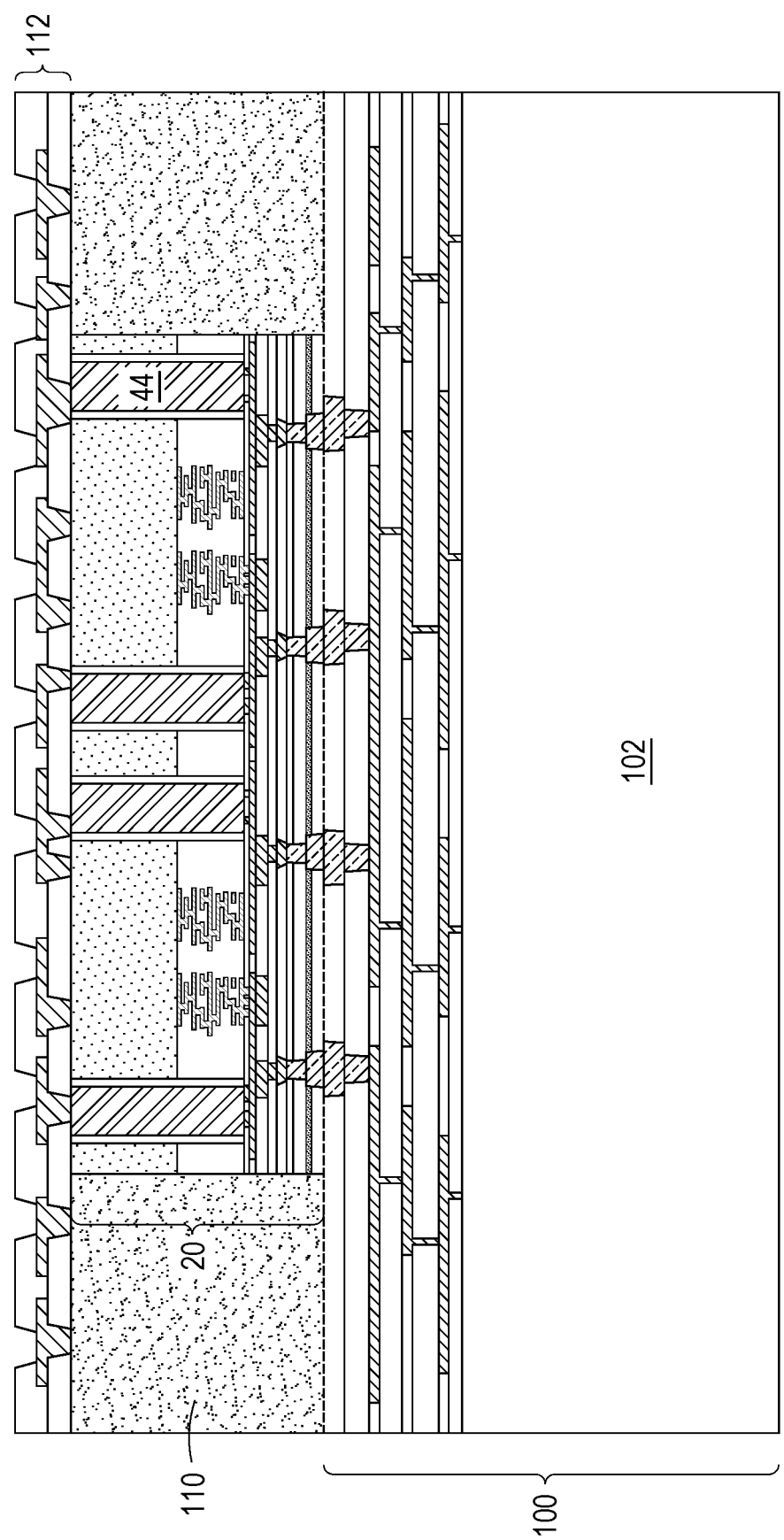

In FIG. 24, a redistribution structure 112 is deposited on the encapsulant 110, the TSVs 44, and the integrated circuit die 20. The redistribution structure 112 may include redistribution lines (RDLs), such as metal traces (or metal lines), and vias underlying and connected to the metal traces. The redistribution lines of the redistribution structure 112 are physically and electrically connected to the TSVs 44 of the die 20.

In accordance with some embodiments of the present disclosure, the RDLs are formed through plating processes, wherein each of the RDLs includes a seed layer (not shown) and a plated metallic material over the seed layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the RDLs. The patterning forms openings through the photoresist to expose the seed layer. A conductive material is formed in the openings of the photoresist and on the exposed portions of the seed layer. The conductive material may be formed by plating, such as electroplating or electroless plating, or the like. The seed layer and the plated metallic material may be formed of the same material or different materials. The conductive material may be a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet and/or dry etching. The remaining portions of the seed layer and conductive material form the RDLs.

Dielectric or passivation layers may be formed over each layer of the metal traces. In some embodiments, the dielectric or passivation layers are formed of a polymer, which may be a photo-sensitive material such as PBO, polyimide, BCB, or the like, that may be patterned using a lithography mask. In other embodiments, the dielectric or passivation layers are formed of a nitride such as silicon nitride; an oxide such as silicon oxide, PSG, BSG, BPSG; or the like. The dielectric or passivation layers may be formed by spin coating, lamination, CVD, the like, or a combination thereof.

Openings may be formed in the top dielectric or passivation layer with a patterning process, exposing some or all of the top metal layer of the redistribution structure 112. The patterning process may be an acceptable process, such as by exposing the dielectric or passivation layer to light when the dielectric layer is a photo-sensitive material or by etching using, for example, an anisotropic etch.

Figure 25:
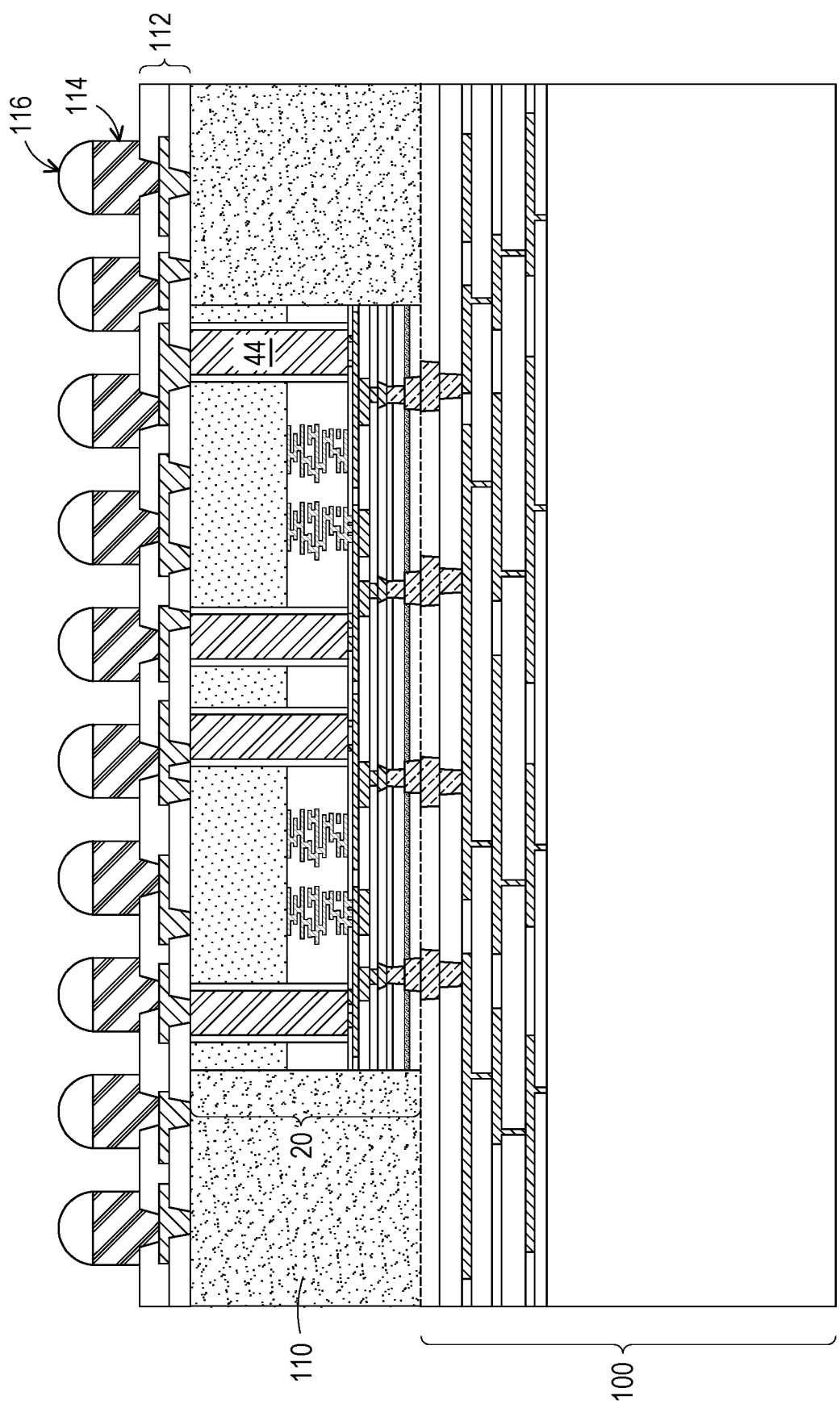

As shown in FIG. 25, bumps 114 are formed through the openings in the dielectric layers of the redistribution structure 112 to contact metallization patterns in the redistribution structure 112. The bumps 114 may be metal pillars, controlled collapse chip connection (C4) bumps, micro bumps, electroless nickel-electroless palladium-immersion gold technique (ENEPIG) formed bumps, ball grid array (BGA) bumps, or the like. In an embodiment, the bumps 114 are C4 bumps. The bumps 114 may be formed by sputtering, printing, electro plating, electroless plating, CVD, or the like. The bumps 114 may be solder free and have substantially vertical sidewalls. In some embodiments, a metal cap layer (not shown) is formed on the top of the bumps 114. The metal cap layer may include nickel, tin, tin-lead, gold, silver, palladium, indium, nickel-palladium-gold, nickel-gold, the like, or a combination thereof and may be formed by a plating process.

Further shown in FIG. 25, conductive connectors 116 are formed on the bumps 114. The conductive connectors 116 may be formed from a conductive material such as solder, copper, aluminum, gold, nickel, silver, palladium, tin, the like, or a combination thereof. In some embodiments, the conductive connectors 116 are formed by initially forming a layer of solder through methods such as evaporation, electroplating, printing, solder transfer, ball placement, or the like. Once a layer of solder has been formed on the structure, a reflow may be performed in order to shape the conductive connectors 116 into desired bump shapes.

Figure 26:
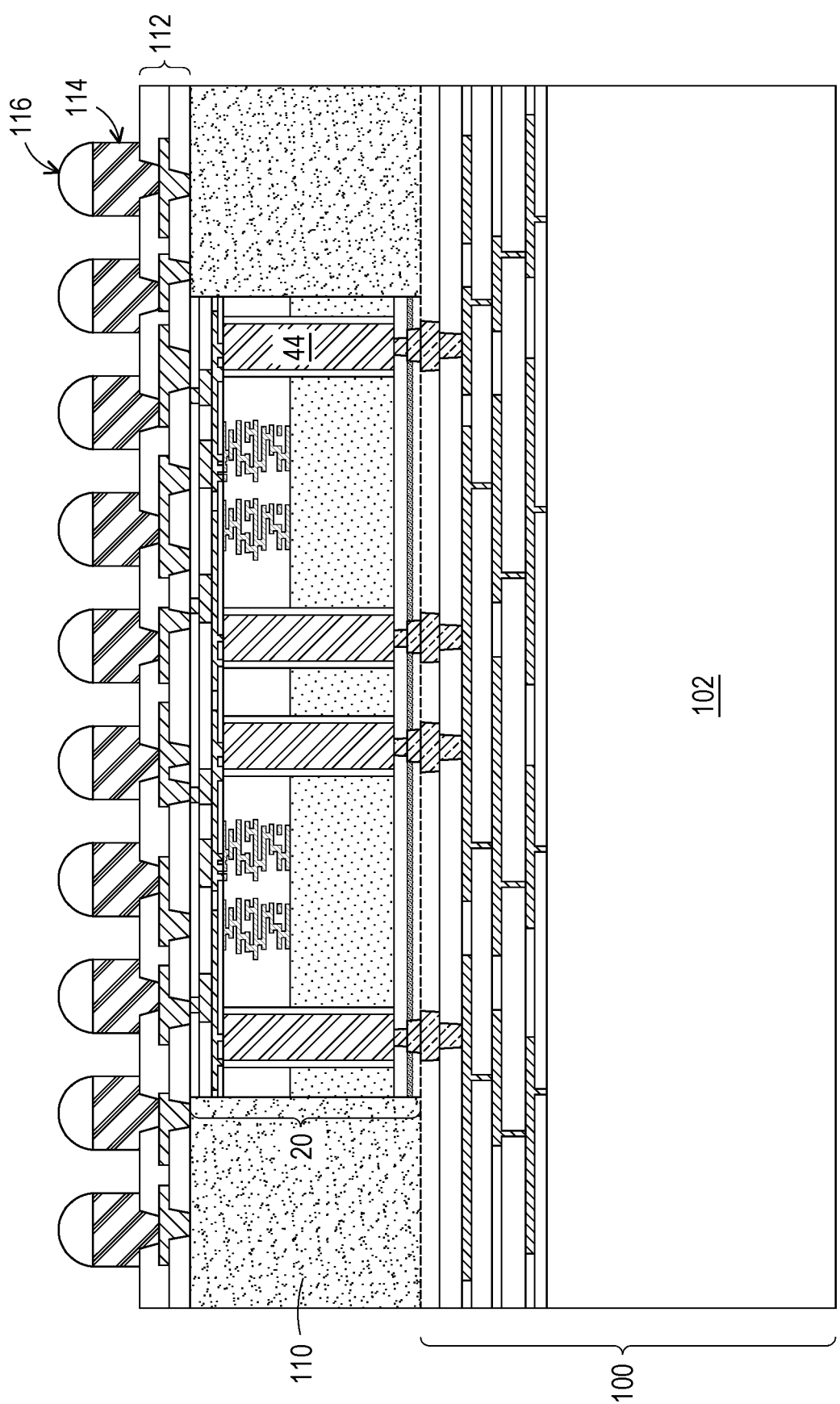
FIG. 26 illustrates a cross-sectional view of an intermediate stage in the formation of a package according to some embodiments.

The embodiment depicted in FIG. 25 is a chip-on-wafer structure bonded in a face-to-face configuration. Alternatively, the integrated circuit die 20 and the package structure 100 may be bonded in a face-to-back configuration, as shown in FIG. 26. For example, in FIG. 26, the back of the die 20 (e.g., exposed ends of the TSVs 44 and substrate 22) is bonded to the face of the package structure 100. Details regarding this embodiment that are similar to those for the previously described embodiment are not repeated herein.

Figure 27:
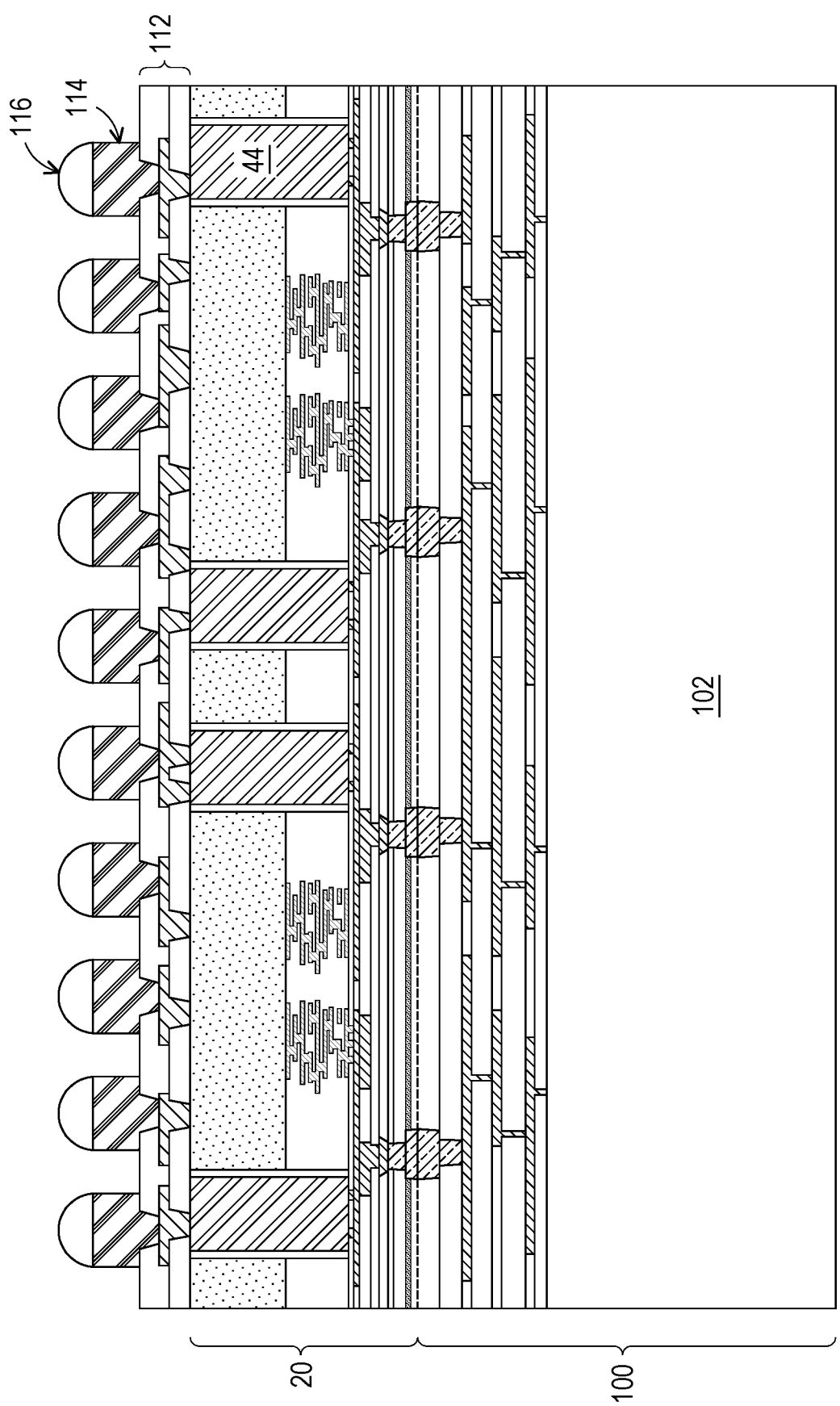
FIG. 27 illustrates a cross-sectional view of an intermediate stage in the formation of a package according to some embodiments.

FIG. 27 illustrates a cross-sectional view of a wafer-on-wafer structure in accordance with some embodiments. This embodiment is similar to the embodiment illustrated in FIGS. 1 through 25 except that this embodiment is a wafer-on-wafer structure instead of a chip-on-wafer structure. Details regarding this embodiment that are similar to those for the previously described embodiment will not be repeated herein.

In FIG. 27, the structure is a wafer-on-wafer structure bonded in a face-to-face configuration in which the upper structure is a wafer 20. The wafer 20 is formed similar to the die 20 described above and the description is not repeated herein. With this embodiment, the steps of singulating the die 20 and the formation of the encapsulant 110 in the previous embodiment are no longer needed and those steps can be omitted from this embodiment. In this embodiment, the wafer 20 and the package structure 100 are both wafers and are a same size.

In other embodiments, the wafer 20 may be bonded to the package structure 100 in a face-to-back configuration. For example, the back of the wafer 20 (e.g., exposed ends of the TSVs 44 and substrate 22) could be bonded to the face of the package structure 100.

The die/wafer 20 can be include in various other packages, such as integrated fan-out packages or chip-on-wafer-on-substrate packages. For example, the die 20 can be bonded to an interposer that is bonded to a package substrate in a chip-on-wafer-on-substate packages. Further, multiple dies 20 can be packaged together with a redistribution structure (similar to 112 discussed above) in an integrated fan-out package. Moreover, the die 20 can be encapsulated in a molding compound and have through molding vias adjacent the die 20 with another package structure bonded over the die 20 in an integrated fan-out package. Said another way, the bond pad and redistribution structures disclosed can be included in any package structure where they are suitable.

Figure 28A:
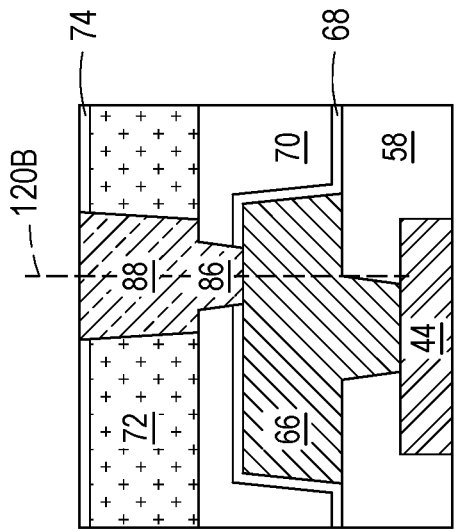
FIGS. 28A, 28B, 28C, and 28D illustrate cross-sectional views of bond redistribution structures according to some embodiments.
Figure 28B:
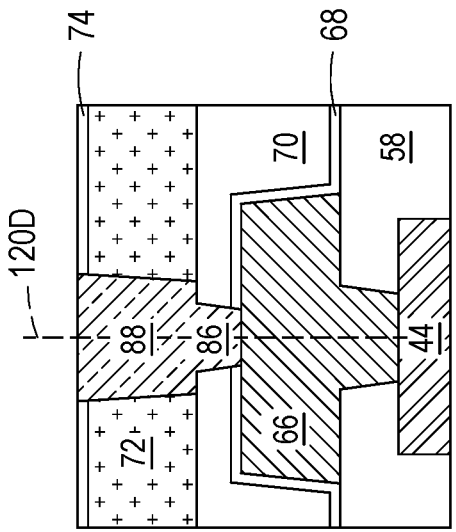
Figure 28C:
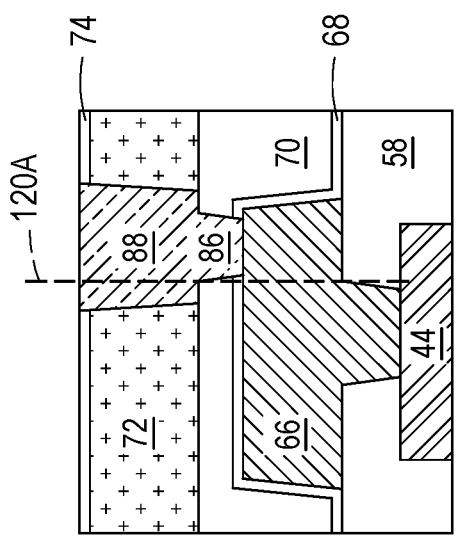
Figure 28D:
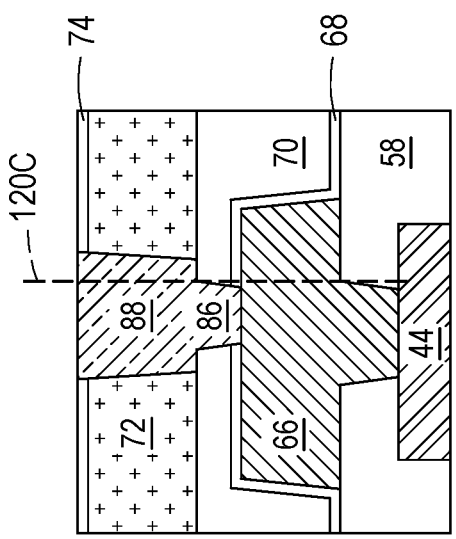

FIGS. 28A, 28B, 28C, and 28D illustrate cross-sectional views of detailed views of redistribution and bond pad structures in accordance with various embodiments. FIGS. 28A-28D illustrate various alignments of the redistribution via 66 and the bond pad via 86 in accordance with some embodiments. In FIG. 28A, an edge of the redistribution via 66 is aligned with an edge of the bond pad via 86 such that there is little to no overlap between the two vias 66 and 86 (see, e.g., line 120A). In FIG. 28B, an edge of the redistribution via 66 is aligned with a center of the bond pad via 86 such that there is some overlap (e.g., substantially half overlapped) between the two vias 66 and 86 (see, e.g., line 120B). In FIG. 28C, an edge of the redistribution via 66 is aligned with an edge of the bond pad via 86 such that there substantially full overlap between the two vias 66 and 86 (see, e.g., line 120C). In FIG. 28D, a center of the redistribution via 66 is aligned with a center of the bond pad via 86 such that there is full overlap between the two vias 66 and 86 (see, e.g., line 120 D). These embodiments illustrate various configurations of the alignment of the bond pad vias 86 and the redistribution vias 66. In the embodiment of FIG. 28D (e.g., centers of the vias being aligned), can allow for the largest reduction in pitch for the bond pads 88.

Figure 29A:
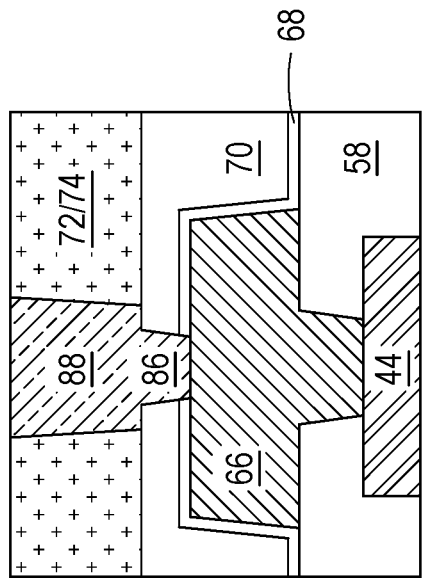
FIGS. 29A, 29B, 29C, and 29D illustrate cross-sectional views of bond redistribution structures according to some embodiments.
Figure 29B:
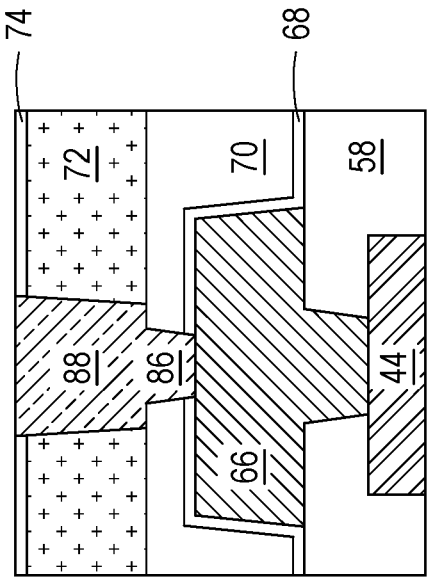
Figure 29C:
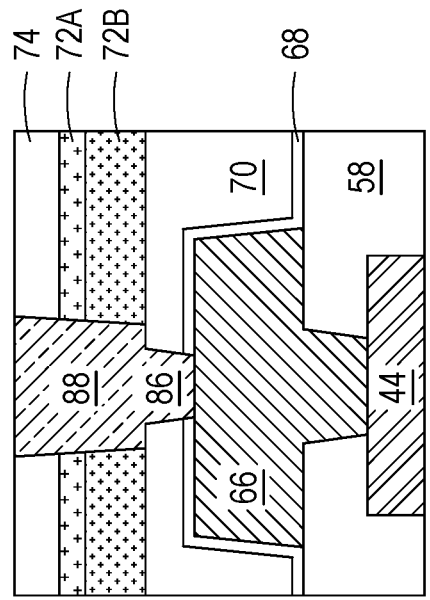
Figure 29D:
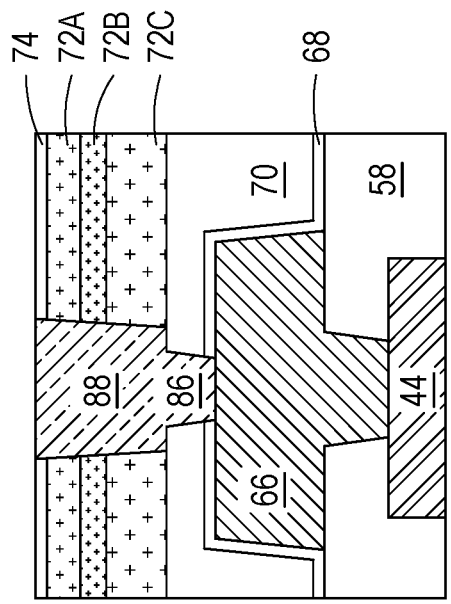

FIGS. 29A, 29B, 29C, and 29D illustrate cross-sectional views of detailed views of redistribution and bond pad structures in accordance with various embodiments. FIGS. 29A-29D illustrate various configurations of the warpage control layer 72 and the bonding layer 74 in accordance with some embodiments. In FIG. 29A, the two layers 74 and 72 are replaced with a single layer 72/74 that functions as both a warpage control layer and a bonding layer. In FIG. 29B, similar to the embodiment in FIGS. 1-20, the planarization layer 70, the warpage control layer 72, and the bonding layer 74 are each separate layers. In FIGS. 29C and 29D, the warpage control layer 72 includes sub layers 72A-C. In FIG. 29C, there are two sublayers 72A and 72B of the warpage control layer 72. In FIG. 29D, there are three sublayers 72A, 72B, and 72C of the warpage control layer 72.

In the embodiments of FIGS. 29A-29D, the warpage control layer 72 and the bonding layer have 74 high modulus and high thermal conductivity materials such as silicon nitride, silicon oxynitride, silicon carbide, silicon carbon nitride, silicon oxycarbide, the like, or combinations and sublayers thereof.

FIGS. 30A, 30B, 31A, 31B, 31C, and 31D illustrate cross-sectional views of detailed views of redistribution and bond pad structures in accordance with various embodiments. FIGS. 30A-B and 31A-D illustrate various configurations of the layers 70, 72, and 74 including interlayers 130 between these layers. The interlayers 130 are between the bonding layer 74 and the warpage control layer 72, between warpage control layers 72, and/or between planarization layers 70 and warpage control layers 72 to improve adhesion between these layers. The interlayers 130 includes first elements from the underlying layer, and second elements from the overlying layer. For example, the interlayer 130 may be SiCN when the underlying layer comprises SiN and the overlying layer comprises SiC. As another example, when the bonding layer 74 and the warpage control layer 72 respectively comprise SiN, SiON, SiC, SiCN, and/or SiCO, the interlayers 130 between them may comprise SiCN, SiON, and/or SiCO.

Figure 30B:
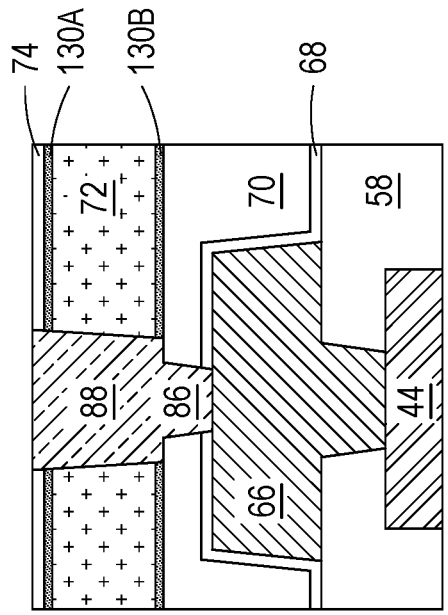
FIGS. 30A and 30B illustrate cross-sectional views of bond redistribution structures according to some embodiments.
Figure 30A:
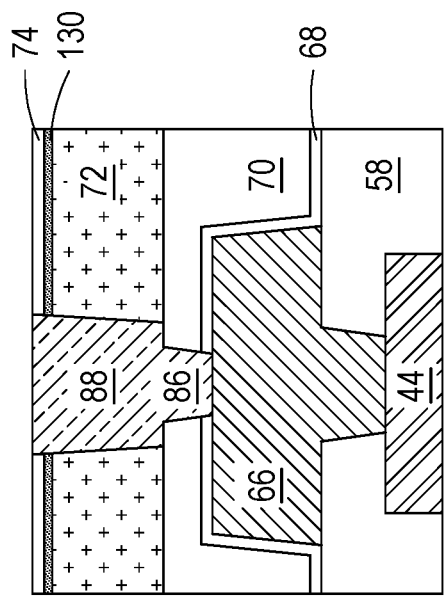

FIGS. 30A and 30B illustrate configurations with interlayers 130 and one warpage control layer 72. In FIG. 30A, an interlayer 130 is between the warpage control layer 72 and the bonding layer 74. In FIG. 30B, there are two interlayers 130A and 130B. The interlayer 130A is between the warpage control layer 72 and the bonding layer 74 and the interlayer 130B is between the warpage control layer 72 and the planarization layer 70.

Figure 31A:
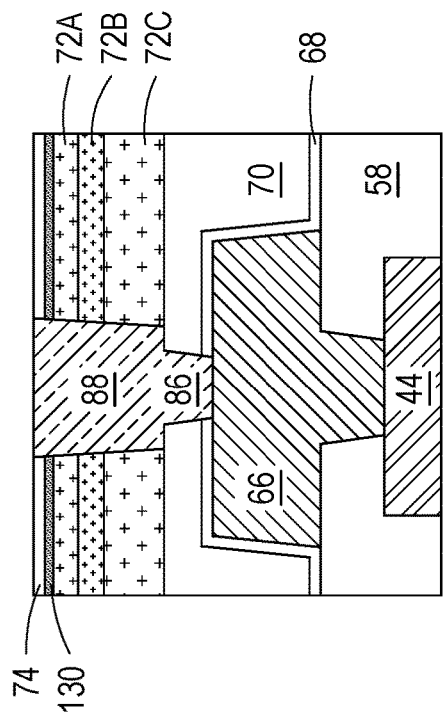
FIGS. 31A, 31B, 31C, and 31D illustrate cross-sectional views of bond redistribution structures according to some embodiments.
Figure 31B:
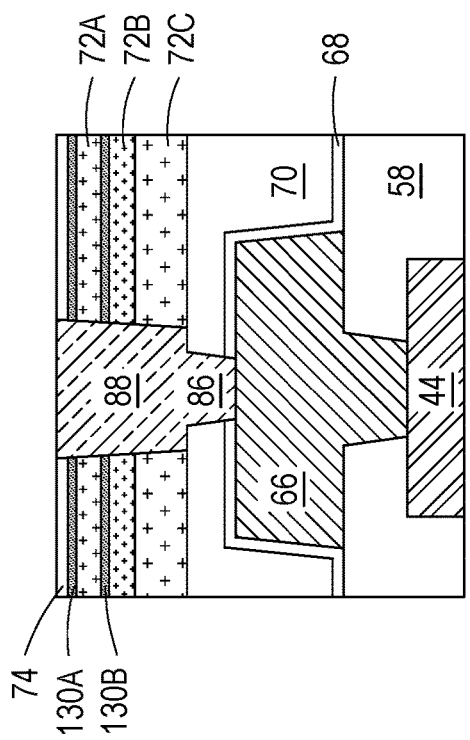
Figure 31C:
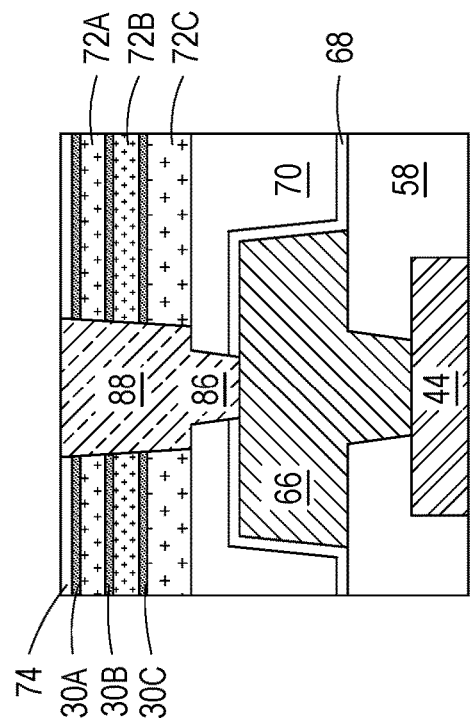
Figure 31D:
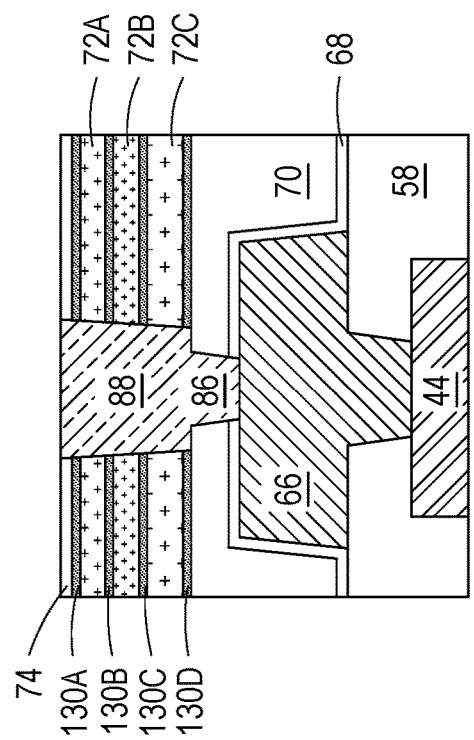

FIGS. 31A-D illustrate configurations with interlayers 130 and multiple warpage control layers 72. In FIG. 31A an interlayer 130 is between the warpage control layer 72A and the bonding layer 74. In FIG. 31B, a first interlayer 130A is between the warpage control layer 72A and the bonding layer 74, and a second interlayer 130B is between the warpage control layers 72A and 72B. In FIG. 31C, a first interlayer 130A is between the warpage control layer 72A and the bonding layer 74, a second interlayer 130B is between the warpage control layers 72A and 72B, and a third interlayer 130C is between the warpage control layers 72B and 72C. In FIG. 31D, a first interlayer 130A is between the warpage control layer 72A and the bonding layer 74, a second interlayer 130B is between the warpage control layers 72A and 72B, a third interlayer 130C is between the warpage control layers 72B and 72C, and a fourth interlayer 130D is between the warpage control layer 72C and the planarization layer 70.

Figure 32A:
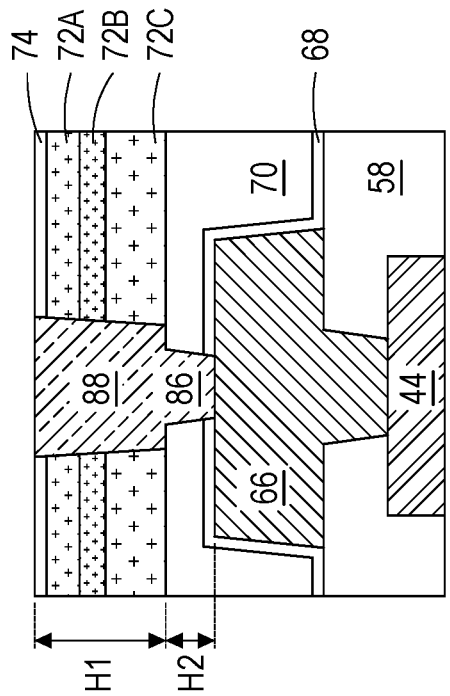
FIGS. 32A and 32B illustrate cross-sectional views of bond redistribution structures according to some embodiments.
Figure 32B:
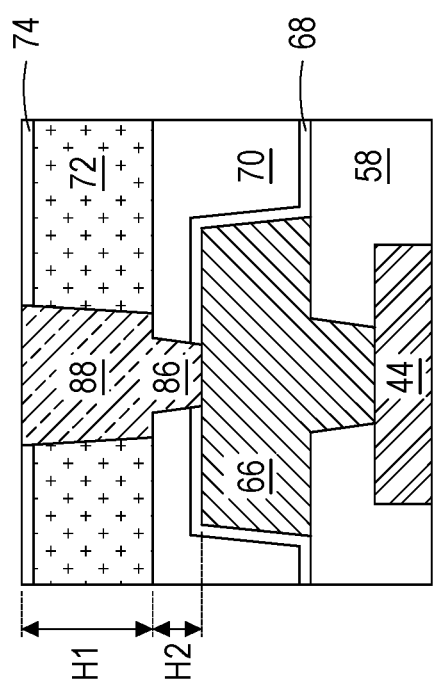

FIGS. 32A-B and 33A-B illustrate cross-sectional views of detailed views of redistribution and bond pad structures in accordance with various embodiments. FIGS. 32A-B and 33A-B illustrate various configurations of heights and widths of the bond pad vias 86 and the bond pads 88. In FIGS. 32A and 32B, the bond pad 88 has a height H1 as measured from a bottom surface to a top surface, and the bond pad via 86 has a height H2 as measured from a bottom surface to a top surface. In some embodiments, the ratio of the heights H2/H1 can be from 0.5 to 15. In some embodiments, can be less than 1, such as 0.5. By increasing the bond pad height H1 relative to the bond pad via height H2, the device has improved electrical and thermal conductivity.

Figure 33B:
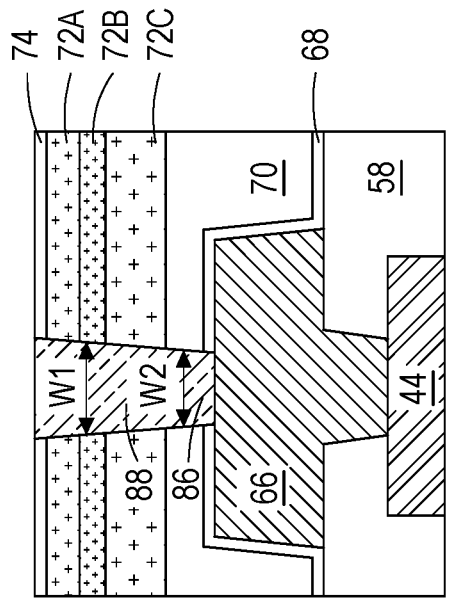
FIGS. 33A and 33B illustrate cross-sectional views of bond redistribution structures according to some embodiments.
Figure 33A:
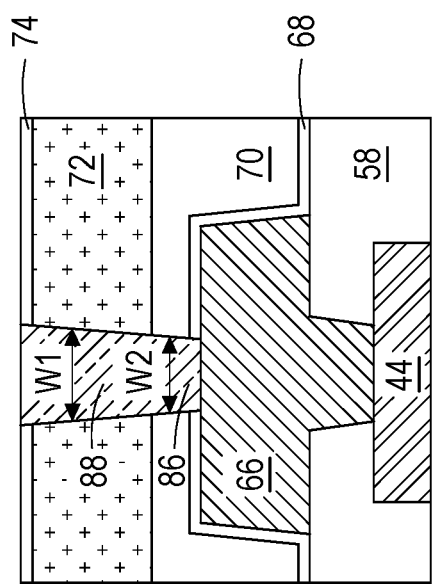

In FIGS. 33A and 33B, the bond pad 88 has a width W1 as measured from outer surfaces, and the bond pad via 86 has width W2 as measured from outer surfaces. In some embodiments, the ratio of the widths W1/W2 can be from 1 to 1.38. If the ratio of the W1/W2 is 1 then the bond pad vias 86 and the bond pad 88 can be formed with a single lithography process.

Considering the height and width adjustments together, the height ratio H2/H1 can range from 1 to 10 and the width ratio W1/W2 can range from 1 to 3.

The various configurations of FIGS. 28A through 33B described above can be combined together in various combinations of the configurations. Only a portion of the contemplated configurations have been illustrated, but other configurations are within the scope of this disclosure.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. In some embodiments, a layer of solder may be formed over the redistribution pad 66 for more reliable probe testing and the solder is then removed before formation of the overlaying layers and bond pads. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments discussed herein may be discussed in a specific context, namely a redistribution structure that can be integrated into a device (e.g., a chip or die) or a package (e.g., a chip-on-wafer (CoW) package structure or a wafer-on-wafer (WoW) package structure). The redistribution structure includes a redistribution via and line with a level or flat upper surface to allow for a smaller pitch and minimum distance between adjacent redistribution lines and bond pads and bond pad vias. In some embodiments, the redistribution via and line are formed in a same process, for example, a dual damascene process. In some embodiments, warpage layers and bonding layers with high modulus and high thermal conductivity are formed over the redistribution line and improve the warpage control and heat dissipation. In addition, the ratio of the thickness of the bond pad vias to bond pads is smaller than conventional bond pad vias and bond pads. By having this smaller ratio of thicknesses, the electrical and thermal conductivity of the structure is improved.

An embodiment includes a method including forming a first interconnect structure over a first substrate, the first interconnect structure including dielectric layers and metallization patterns therein. The method also includes forming a redistribution via and a redistribution pad over the first interconnect structure, the redistribution via and the redistribution pad being electrically coupled to at least one of the metallization patterns of the first interconnect structure, the redistribution via and the redistribution pad having a same material composition. The method also includes forming a warpage control dielectric layer over the redistribution pad. The method also includes forming a bond via and a bond pad over the redistribution pad, the bond pad being in the warpage control dielectric layer, the bond via being electrically coupled to the redistribution pad.

Embodiments may include one or more of the following features. The method where the redistribution via and the redistribution pad each include copper. The bond pad and bond via each include copper. The redistribution via and the redistribution pad are formed by a single deposition process. Forming a redistribution via and a redistribution pad over the first interconnect structure includes forming a dielectric layer over the metallization patterns of the first interconnect structure, forming openings in the dielectric layer to expose top metal structures of the first interconnect structure, forming a seed layer over the dielectric layer and on the exposed top metal structures in the openings of the dielectric layer, forming and patterning a mask layer over the seed layer, and performing a plating process to form the redistribution via and the redistribution pad in the patterned mask layer, the redistribution via being in the opening of the dielectric layer. The method further including removing the patterned mask layer, and removing the exposed seed layer from a top surface of the dielectric layer. The bond pad via overlaps the redistribution via. The method further including forming a dielectric layer over the metallization patterns of the first interconnect structure, the redistribution via being through the dielectric layer and the redistribution pad being over the dielectric layer, forming a conformal dielectric layer over the dielectric layer and the redistribution pad, forming a planarization dielectric layer over the conformal dielectric layer, the warpage control dielectric layer being on the planarization dielectric layer, and forming a bonding dielectric layer on the warpage control dielectric layer. The bond via extends through the planarization dielectric layer and the conformal dielectric layer, and where the bond pad extends through the bonding dielectric layer and the warpage control dielectric layer. The method further including forming a second warpage control dielectric layer on the warpage control dielectric layer, the material composition of the second warpage control dielectric layer being different than the warpage control dielectric layer. The method further including an interlayer between the second warpage control dielectric layer and the second warpage control dielectric layer, the material composition of the interlayer being different than both the second warpage control dielectric layer and the warpage control dielectric layer. The method further including forming a first bonding dielectric layer on the warpage control dielectric layer, and directly bonding the first bonding dielectric layer and the bond pad to a second bonding dielectric layer and a second bond pad of a package structure, the package structure including a second substrate and a second interconnect structure over the second substrate.

An embodiment includes a structure including a first interconnect structure over a first substrate, the first interconnect structure including dielectric layers and metallization patterns therein. The structure also includes a passivation layer over the metallization patterns of the first interconnect structure. The structure also includes a redistribution via and a redistribution pad over the first interconnect structure, the redistribution via and the redistribution pad being electrically coupled to at least one of the metallization patterns of the first interconnect structure, the redistribution via being through the passivation layer and the redistribution pad being over the passivation layer, the redistribution via and the redistribution pad having a same material composition, and a conformal dielectric layer over the passivation layer and the redistribution pad. The structure also includes a planarization dielectric layer over the conformal dielectric layer. The structure also includes one or more warpage control dielectric layers being over the planarization dielectric layer. The structure also includes a bonding dielectric layer on the warpage control dielectric layer. The structure also includes a bond via and a bond pad over the redistribution pad, the bond pad being in the warpage control dielectric layer and the bonding dielectric layer, the bond via in the planarization dielectric layer and electrically coupled to the redistribution pad.

Embodiments may include one or more of the following features. The structure where a height of the bond pad is greater than a height of the bond via. The redistribution via, the redistribution pad, the bond pad, and the bond via each include copper. The bond via overlaps the redistribution via. The one or more warpage control dielectric layers includes multiple warpage control dielectric layers. The bonding dielectric layer and the multiple warpage control dielectric layers each include silicon nitride, silicon oxynitride, silicon carbide, silicon carbon nitride, silicon oxycarbide, or combinations and sublayers thereof.

An embodiment includes a structure including a first interconnect structure over a first substrate, the first interconnect structure including dielectric layers and metallization patterns therein. The structure also includes a through substrate via extending through the first interconnect structure and the first substrate. The structure also includes a redistribution via over the first interconnect structure, the redistribution via being electrically coupled to at least one of the metallization patterns of the first interconnect structure. The structure also includes a redistribution pad over the redistribution via, the redistribution pad being electrically coupled to the redistribution via, the redistribution pad and the redistribution via being a continuous conductive material. The structure also includes a via define layer over the redistribution pad, the via define layer being a conformal dielectric layer. The structure also includes a planarization dielectric layer over the via define layer. The structure also includes one or more warpage control dielectric layers over the planarization dielectric layer. The structure also includes a bond via in the planarization dielectric layer and the via define layer, the bonding via being electrically coupled to the redistribution pad, the bond via overlapping the redistribution via. The structure also includes a bond pad in the one or more warpage control dielectric layers, the bond pad being electrically coupled to the bond via, the bond pad overlapping the redistribution via.

Embodiments may include one or more of the following features. The structure further including a bonding dielectric layer over the one or more warpage control dielectric layers, the bond via being in the bonding dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first interconnect structure over a first substrate, the first interconnect structure comprising dielectric layers and metallization patterns therein;
    forming a dielectric layer over the metallization patterns of the first interconnect structure;
    forming a redistribution via and a redistribution pad over the first interconnect structure, the redistribution via and the redistribution pad being electrically coupled to at least one of the metallization patterns of the first interconnect structure, the redistribution via and the redistribution pad having a same material composition, the redistribution via being through the dielectric layer and the redistribution pad being over the dielectric layer;
    forming a conformal dielectric layer over the dielectric layer and the redistribution pad, the conformal dielectric layer having a same thickness over the redistribution pad and the dielectric layer;
    forming a planarization dielectric layer over the conformal dielectric layer;
    forming a warpage control dielectric layer over the planarization dielectric layer;
    forming a first bonding dielectric layer on the warpage control dielectric layer, the first bonding dielectric layer physically contacting the warpage control dielectric layer;
    forming a bond via and a bond pad over and electrically coupled to the redistribution pad, the bond pad being in the warpage control dielectric layer and the first bonding dielectric layer, the bond via being in the planarization dielectric layer and the conformal dielectric layer; and
    directly bonding the first bonding dielectric layer and the bond pad to a second bonding dielectric layer and a second bond pad of a package structure, the package structure comprising a second substrate and a second interconnect structure over the second substrate.

2. The method of claim 1, wherein the redistribution via and the redistribution pad each comprise copper.

3. The method of claim 2, wherein the bond pad and bond via each comprise copper.

4. The method of claim 1, wherein the redistribution via and the redistribution pad are formed by a single deposition process.

5. The method of claim 1, wherein forming the redistribution via and the redistribution pad over the first interconnect structure comprises:

forming openings in the dielectric layer to expose top metal structures of the first interconnect structure; and forming a seed layer over the dielectric layer and on the exposed top metal structures in the openings of the dielectric layer;

forming and patterning a mask layer over the seed layer; and performing a plating process to form the redistribution via and the redistribution pad in the patterned mask layer, the redistribution via being in one of the openings of the dielectric layer.

6. The method of claim 5, further comprising:

removing the patterned mask layer; and removing exposed seed layer from a top surface of the dielectric layer.

7. The method of claim 1, wherein the bond via overlaps the redistribution via.

8. The method of claim 1, further comprising:

forming a second warpage control dielectric layer on the warpage control dielectric layer, a material composition of the second warpage control dielectric layer being different than the warpage control dielectric layer.

9. The method of claim 8, further comprising:

an interlayer between the second warpage control dielectric layer and the warpage control dielectric layer, the material composition of the interlayer being different than both the second warpage control dielectric layer and the warpage control dielectric layer.

10. The method of claim 1 further comprising:

etching a first opening through the first bonding dielectric layer and the warpage control dielectric layer;

etching a second opening through the planarization dielectric layer and the conformal dielectric layer, the first opening being wider than the second opening, the redistribution pad being exposed in second opening; and forming the bond via in the second opening and the bond pad in the first opening.

11. The method of claim 1, wherein the warpage control dielectric layer comprises silicon carbide, silicon carbon nitride, or silicon oxycarbide.

12. A structure comprising:

a first interconnect structure over a first substrate, the first interconnect structure comprising dielectric layers and metallization patterns therein;

a passivation layer over the metallization patterns of the first interconnect structure;

a redistribution via and a redistribution pad over the first interconnect structure, the redistribution via and the redistribution pad being electrically coupled to at least one of the metallization patterns of the first interconnect structure, the redistribution via being through the passivation layer and the redistribution pad being over the passivation layer, the redistribution via and the redistribution pad having a same material composition;

a conformal dielectric layer over the passivation layer and the redistribution pad, the conformal dielectric layer having a same thickness over the redistribution pad and the passivation layer;

a planarization dielectric layer over the conformal dielectric layer;

a first warpage control dielectric layer over the planarization dielectric layer, the first warpage control dielectric layer comprising silicon and carbon;

a second warpage control dielectric layer over the first warpage control dielectric layer, a material composition of the second warpage control dielectric layer being different than the first warpage control dielectric layer;

a bonding dielectric layer on the second warpage control dielectric layer;

a bond via and a bond pad over the redistribution pad, the bond pad being in the first and second warpage control dielectric layers and the bonding dielectric layer, the bond via in the planarization dielectric layer and electrically coupled to the redistribution pad; and a second bonding dielectric layer and a second bond pad of a package structure being directly bonded to the bond pad and the bonding dielectric layer.

13. The structure of claim 12, wherein a height of the bond pad is greater than a height of the bond via.

14. The structure of claim 12, wherein the redistribution via, the redistribution pad, the bond pad, and the bond via each comprise copper.

15. The structure of claim 12, wherein the bond via overlaps the redistribution via.

16. The structure of claim 12, wherein the bonding dielectric layer and the first and second warpage control dielectric layers each comprise silicon nitride, silicon oxynitride, silicon carbide, silicon carbon nitride, silicon oxycarbide, or combinations and sublayers thereof.

17. The structure of claim 12, further comprising:

a third warpage control dielectric layer between the first and second warpage control dielectric layers.

18. A structure comprising:

a first interconnect structure over a first substrate, the first interconnect structure comprising dielectric layers and metallization patterns therein;

a through substrate via extending through the first interconnect structure and the first substrate;

a redistribution via over the first interconnect structure, the redistribution via being electrically coupled to at least one of the metallization patterns of the first interconnect structure;

a redistribution pad over the redistribution via, the redistribution pad being electrically coupled to the redistribution via, the redistribution pad and the redistribution via being a continuous conductive material;

a via define layer over the redistribution pad, the via define layer, the via define layer having a same thickness over the redistribution pad and the first interconnect structure;

a planarization dielectric layer over the via define layer;

one or more warpage control dielectric layers over the planarization dielectric layer, at least one of the warpage control dielectric layers comprising silicon and carbon;

a first bonding dielectric layer on the one or more warpage control dielectric layers; and a bond via in the planarization dielectric layer and the via define layer, the bond via being electrically coupled to the redistribution pad, the bond via overlapping the redistribution via;

a first bond pad in the one or more warpage control dielectric layers and the first bonding dielectric layer, the first bond pad being electrically coupled to the bond via, the first bond pad overlapping the redistribution via; and a second bonding dielectric layer and a second bond pad of a package structure being directly bonded to the first bond pad and the first bonding dielectric layer, the package structure comprising a second substrate and a second interconnect structure.

19. The structure of claim 17, wherein a material composition of the third warpage control dielectric layer being different than the second warpage control dielectric layer.

20. The structure of claim 18, wherein the one or more warpage control dielectric layers comprises:
  a first warpage control dielectric layer; and
  a second warpage control dielectric layer over the first warpage control dielectric layer, a material composition of the second warpage control dielectric layer being different than the first warpage control dielectric layer.

* * * * *